(12) United States Patent
Ritter et al.

(10) Patent No.: US 8,760,330 B2
(45) Date of Patent: Jun. 24, 2014

(54) ANALOG-TO-DIGITAL CONVERTER, SIGNAL PROCESSOR, AND METHOD FOR ANALOG-TO-DIGITAL CONVERSION

(75) Inventors: Rudolf Ritter, Ulm (DE); Markus Schimper, Moosinning (DE); Werner Schelmbauer, Steyr (AT); Maurits Ortsmanns, Ulm (DE)

(73) Assignee: Intel Mobile Communications GmbH, Neubiberg (DE)

( * ) Notice: Subject to any disclaimer, the term of this patent is extended or adjusted under 35 U.S.C. 154(b) by 65 days.

(21) Appl. No.: 13/362,565

(22) Filed: Jan. 31, 2012

(65) Prior Publication Data

US 2013/0194114 A1    Aug. 1, 2013

(51) Int. Cl.
*H03M 3/02* (2006.01)
*H04B 1/10* (2006.01)
*H04B 1/12* (2006.01)
*H03M 3/00* (2006.01)

(52) U.S. Cl.
CPC .............. *H04B 1/123* (2013.01); *H04B 1/1036* (2013.01); *H03M 3/30* (2013.01)
USPC ............................. 341/143; 455/296; 375/346

(58) Field of Classification Search
USPC ............ 341/143, 155; 375/346, 349; 455/296
See application file for complete search history.

(56) References Cited

U.S. PATENT DOCUMENTS

| | | | |
|---|---|---|---|
| 7,218,904 B2 * | 5/2007 | Staszewski et al. | 455/232.1 |
| 2005/0275576 A1 * | 12/2005 | Fudge et al. | 341/155 |
| 2006/0030286 A1 * | 2/2006 | Haub et al. | 455/295 |
| 2008/0129569 A1 * | 6/2008 | Muhammad et al. | 341/155 |
| 2008/0214135 A1 * | 9/2008 | Muhammad | 455/296 |
| 2009/0086864 A1 * | 4/2009 | Komninakis et al. | 375/346 |
| 2010/0159865 A1 * | 6/2010 | Fudge | 341/155 |
| 2010/0267353 A1 * | 10/2010 | Kerth et al. | 455/296 |
| 2011/0156940 A1 * | 6/2011 | Le Guillou et al. | 341/143 |

OTHER PUBLICATIONS

Venkateswaran et al., Sigma Delta Interference Canceling ADC's for Antenna Arrays, IEEE 10th Workshop on Signal Processing Advances in Wireless Communication, Jun. 2009, pp. 459-463.*
Punskaya, E., Basics of Digital Filters, http://www.slideshare.net/op205/basics-of-digital-filters-presentation, Cambridge University, Jan. 2009.*
Jeffrey G. Andrews. "Interference Cancellation for Cellular Systems: A Contemporary Overview." IEEE Wireless Communications Apr. 2005. 12 Pages.

(Continued)

*Primary Examiner* — Howard Williams
(74) *Attorney, Agent, or Firm* — Eschweiler & Associates, LLC

(57) ABSTRACT

An analog-to-digital converter for converting an input signal includes a sigma-delta modulator for receiving an analog modulator input signal and for providing a digital modulator output signal and an interference cancellation loop. The interference cancellation loop includes a digital filter, a digital-to-analog converter, and a signal combiner. The digital filter is configured to amplify the sigma-delta output signal in a frequency band, attenuate the sigma-delta output signal outside the frequency band and a transition band surrounding the frequency band, and provide a filtered digital feedback signal. The digital-to-analog converter is configured to convert the filtered digital signal to a cancellation signal. The signal combiner is configured to combine the input signal with the cancellation signal resulting in the modulator input signal, in order to at least partially cancel interference signal portions within the input signal.

23 Claims, 30 Drawing Sheets multibit feedback-DAC

(56) References Cited

OTHER PUBLICATIONS

Kathleen Philips, Peter A. C. M. Nuijten, Raf L. J. Roovers, Arthur H. M. van Roermund, Fernando Munoz Chavero, Macarena Tejera Pallares, and Antonio Torralba. "A Continuous-Time ΣΔ ADC With Increased Immunity to Interferers." IEEE Journal of Solid-State Circuits, vol. 39, No. 12, Dec. 2004. 10 Pages.

Nicolas Beilleau, Hassan Aboushady, Franck Montaudon, and Andrela Cathelin. 1.3V 26mW 3.2GS/s Undersampled LC Bandpass ΣΔ ADC for a SDR ISM-band Receiver in 130nm CMOS. 4 Pages.

Sebastian Loeda, H. Martin Reekie, and Bernard Mulgrew. "On the Design of High-Performance Wide-Band Continuous-Time Sigma-Delta Converters Using Numerical Optimization." IEEE Transactions on Circuits and Systems—I: Regular Papers, vol. 53, No. 4, Apr. 2006. 9 Pages.

Ali Naderi, Mohamad Sawan, and Yvon Savaria. "On the Design of Undersampling Continuous-Time Bandpass Delta-Sigma Modulators for Gigahertz Frequency A/D Conversion." IEEE Transactions on Circuits and Systems—I: Regular Papers, vol. 55, No. 11, Dec. 2008. 12 Pages.

Philip M. Chopp and Anas A. Hamoui. Design Constraints for Image-Reject Frequency-Translating ΔΣ Modulators. IEEE Transactions on Circuits and Systems—II: Express Briefs. vol. 56. No. 12. Dec. 2009. 6 Pages.

R. Saad and S. Hoyos. "Sensitivity of single-bit continuous-time ΔΣ analogue-to-digital converters to out-of-band blockers." Electronics Letters Jun. 10, 2010 vol. 46 No. 12. 2 Pages.

Omid Oliaei. "Sigma-Delta Modulator With Spectrally Shaped Feedback." IEEE Transactions on Circuits and Systems—II: Analog and Digital Signal Processing, vol. 50, No. 9, Sep. 2003. 13 Pages.

Jose M. de la Rosa. "Sigma-Delta Modulators: Tutorial Overview, Design Guide, and State-of-the-Art Survey." IEEE Transactions on Circuits and Systems—I: Regular Papers, vol. 58, No. 1, Jan. 2011. 21 Pages.

J. De Maeyer, J. Raman, P. Rombouts and L. Weyten. "STF Behaviour in a CT ΣΔ Modulator." Ghent University Dept. Electronics and Information Systems Laboratory (ELIS). 4 Pages.

Markku Eraeluoto, Juha Kauranierni, and Iiro Hartimo. "VLSI Implementation of IDGH Speed Digital Filters Using Direct Form Delta Structures." Helsinki University of Technology Institute of Radio Communications Laboratory of Signal Processing and Computer Technology. 4 Pages.

Rikky Muller, Simone Gambini, Jan M. Rabaey. "A 0.013mm 5uW DC-Coupled Neural Signal Acquisition IC with 0.5V Supply." ISSCC 2011 / Session 17 / Biomedical & Displays /17.2. 3 Pages.

F. Munoz, K. Philips, A. Torralba. "A 4.7mW 89.5dB DR CT Complex ΔΣ ADC with Built-In LPF." ISSCC 2005 / Session 27 / Filters and Continous-Time Converters / 27.5. 3 Pages.

Hai Tao and John M. Khoury. "A 400-Ms/s Frequency Translating Bandpass Sigma-Delta Modulator." IEEE Journal of Solid-State Circuits, vol. 34, No. 12, Dec. 1999. 12 Pages.

Kimmo Koli, Jarkko Jussila, Pete Sivonen, Sami Kallioinen, Aarno Paerssinen. "A 900MHz Direct ΔΣ Receiver in 65nm CMOS." ISSCC 2010 / Session 3 / Cellular Techniques / 3.5. 3 Pages.

Ardeshir Namdar, Bosco H. Leung. "A 400MHz 12b 18mW IF Digitizer with Mixer Inside a ΣΔ Modulator Loop." Department of Electrical and Computer Engineering, University of Waterloo, Waterloo, Ontario, Canada. 12 Pages.

Anurag Pulincherry, Michael Hufford, Eric Naviasky, and Un-Ku Moon. "A Time-Delay Jitter-Insensitive Continuous-Time Bandpass ΔΣ Modulator Architecture." IEEE Transactions on Circuits and Systems—II: Express Briefs. vol. 52. No. 10. Oct. 2005. 6 Pages.

Anurag Pulincherry, Mike Hufford, Eric Naviasky, Un-ku Moon. "Continuous-Time, Frequency Translating, Bandpass Delta-Sigma Modulator." Oregon State University, Department of Electrical and Computer Engineering. 4 Pages.

Tobias D. Werth, Christoph Schmits, Ralf Wunderlich, and Stefan Heinen. "An Active Feedback Interference Cancellation Technique for Blocker Filtering in RF Receiver Front-Ends." IEEE Journal of Solid-State Circuits, vol. 45, No. 5, May 2010. 9 Pages.

B. Murmann. "AID Converter Trends: Power Dissipation, Scaling and Digitally Assisted Architectures." Stanford University, Stanford, CA. 8 Pages.

Y. Le Guillou and H. Fakhoury. "Elliptic filtering in continuous-time sigma-delta modulator." Electronics Letters Feb. 17, 2005 vol. 41 No. 4.. 2 Pages.

Graham C. Goodwin, Fellow, Richard H. Middleton, and H. Vincent Poor. "High-Speed Digital Signal Processing and Control." Proceedings of the IEEE. vol. 80. No. 2, Feb. 1992. 20 Pages.

Ian Galton. "Delta-Sigma Data Conversion in Wireless Transceivers." IEEE Transactions on Microwave Theory and Techniques, vol. 50, No. 1, Jan. 2002. 14 Pages.

\* cited by examiner multibit feedback-DAC

ANALOG-TO-DIGITAL CONVERTER, SIGNAL PROCESSOR, AND METHOD FOR ANALOG-TO-DIGITAL CONVERSION

FIELD

Embodiments of the present invention relate to an analog-to-digital converter. Further embodiments of the present invention relate to an apparatus comprising an analog-to-digital converter. Further embodiments of the present invention relate to a signal processor and to an apparatus comprising a signal processor. Further embodiments of the present invention relate to a method for analog-to-digital conversion or to a method for processing an input signal. Further embodiments of the present invention relate to a computer readable digital storage medium.

BACKGROUND

In current mobile communications networks, or cellular networks, many users typically need to share the spectrum to achieve high-rate multimedia communication. From the perspective of a communication between a single user and a base transceiver station, the other users and their respective communications with the base transceiver station or with other base transceiver stations cause an interference for the wireless communication at hand. In other words, noise and unwanted signal sources may cause an interference. For example, a radio transceiver may receive strong unwanted signals out of the desired signal range. These so called blocker signals should be filtered out from the received signal early in the receiver path of the transceiver. In the uplink case, a base transceiver station typically needs to simultaneously detect many asynchronous users. In the downlink case, the users (i.e., the communications between the base transceiver station and the different mobile stations) will be scheduled and largely orthogonalized, but the mobile station will still need to cope with a few dominant interfering base transceiver stations.

Blocker signals that are still present in the received signal subject to an analog-to-digital conversion may cause intermodulation distortion and aliasing. Continuous-time delta-sigma modulators may be used as the analog-to-digital converter of a receiver. The use of delta-sigma modulators relaxes the anti-alias filtering requirement but even with these modulators strong out-of-band signals may render the modulator unstable or at least create distortion.

SUMMARY

Embodiments of the present invention provide an analog-to-digital converter for converting an input signal. The analog-to-digital converter comprises a sigma-delta modulator and an interference cancellation loop. The sigma-delta modulator is configured for receiving an analog modulator input signal and for providing a digital modulator output signal. The interference cancellation loop comprises a digital filter, a digital-to-analog converter, and a signal combiner. The digital filter is configured for relatively amplifying the digital modulator output signal in a frequency band, for relatively attenuating the modulator output signal outside the frequency band and a transition band surrounding the frequency band, and for providing a filtered digital feedback signal. The digital-to-analog converter is configured for converting the filtered digital signal to a cancellation signal. The signal combiner is configured for combining the input signal with the cancellation signal resulting in the modulator input signal, in order to at least partially cancel interference signal portions within the input signal.

Further embodiments of the present invention provide a signal processor comprising a forward signal processing path and a feedback signal processing path. The forward signal processing path comprises a sigma-delta modulator. The feedback signal processing path comprises a digital controller for conditioning a modulator output signal and feeding a resulting cancellation signal to an input of the forward signal processing path for selective cancellation of signal portions of an input signal of the signal processor. The digital controller has a characteristic for emphasizing an out-of-band frequency range so that feeding the resulting cancellation signal to the input of the sigma-delta modulator reduces out-of-band signal portions within the out-of-band frequency range of the input signal of the signal processor.

BRIEF DESCRIPTION OF THE FIGURES

Embodiments of the present invention will be described using the accompanying figures, in which.

DETAILED DESCRIPTION

Before in the following embodiments of the present invention will be described in detail using the accompanying figures, it is to be pointed out that the same elements or elements having the same functionality are provided with the same or similar reference numbers and that a repeated description of elements provided with the same or similar reference numbers is typically omitted. Hence, descriptions provided for elements having the same or similar reference numbers are mutually exchangeable. In the following description, a plurality of details are set forth to provide a more thorough explanation of embodiments of the present invention. However, it will be apparent to one skilled in the art that embodiments of the present invention will be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

In order to exploit the available frequency spectrum more efficiently, current wireless communication standards require a tight arrangement of transmission channels in the frequency domain. While in particular current digital signal processing techniques enables receivers to filter out a desired signal from a relatively strong noise floor (i.e., a relatively low signal-to-noise (SNR) ratio), a so-called blocker signal, interferer signal, or interference signal that is at a nearby frequency and has a signal level comparable to or even higher than the desired signal, poses a challenge to most receiver structures. In particular, an analog-to-digital converter of the receiver needs to process the blocker signal and the desired signal with relatively high fidelity, so that the blocker signal may be separated from the desired signal by means of digital processing techniques once a digital signal has been obtained from the analog-to-digital converter. Hence, strong blockers are limiting the performance of the analog-to-digital converter.

Figure 1:
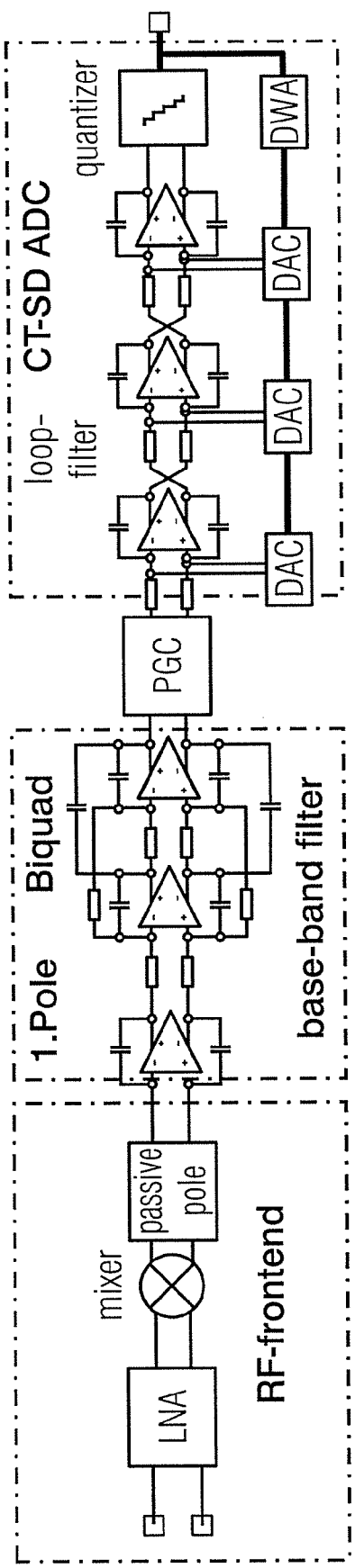
FIG. 1 shows a schematic block diagram of a standard multi-mode, multi-band cellular receiver topology.
Figure 3:
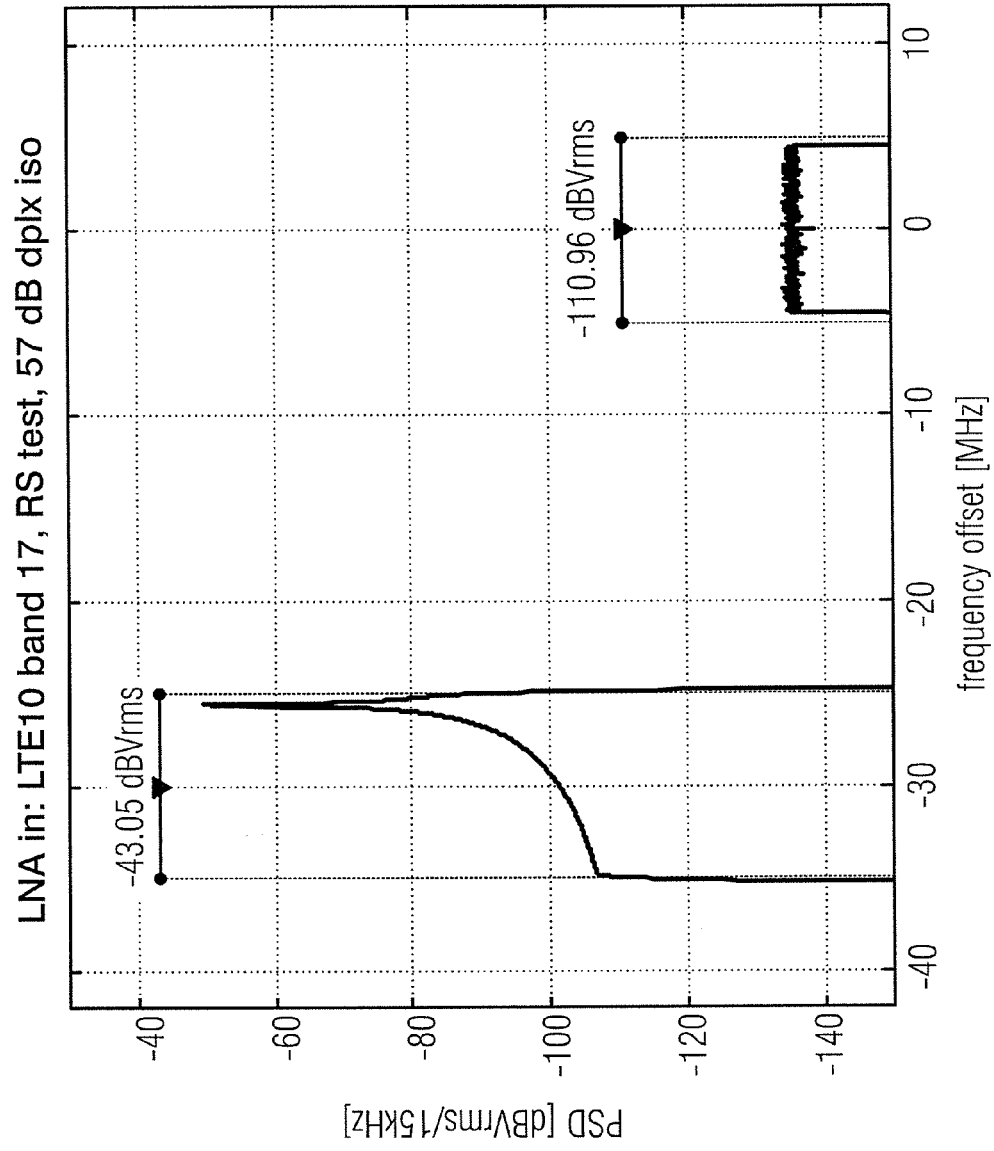
FIG. 3 illustrates a power spectral density according to a test specification of a test that a receiver has to pass under a specific mobile communication standard in order to be standard-compliant.
Figure 4:
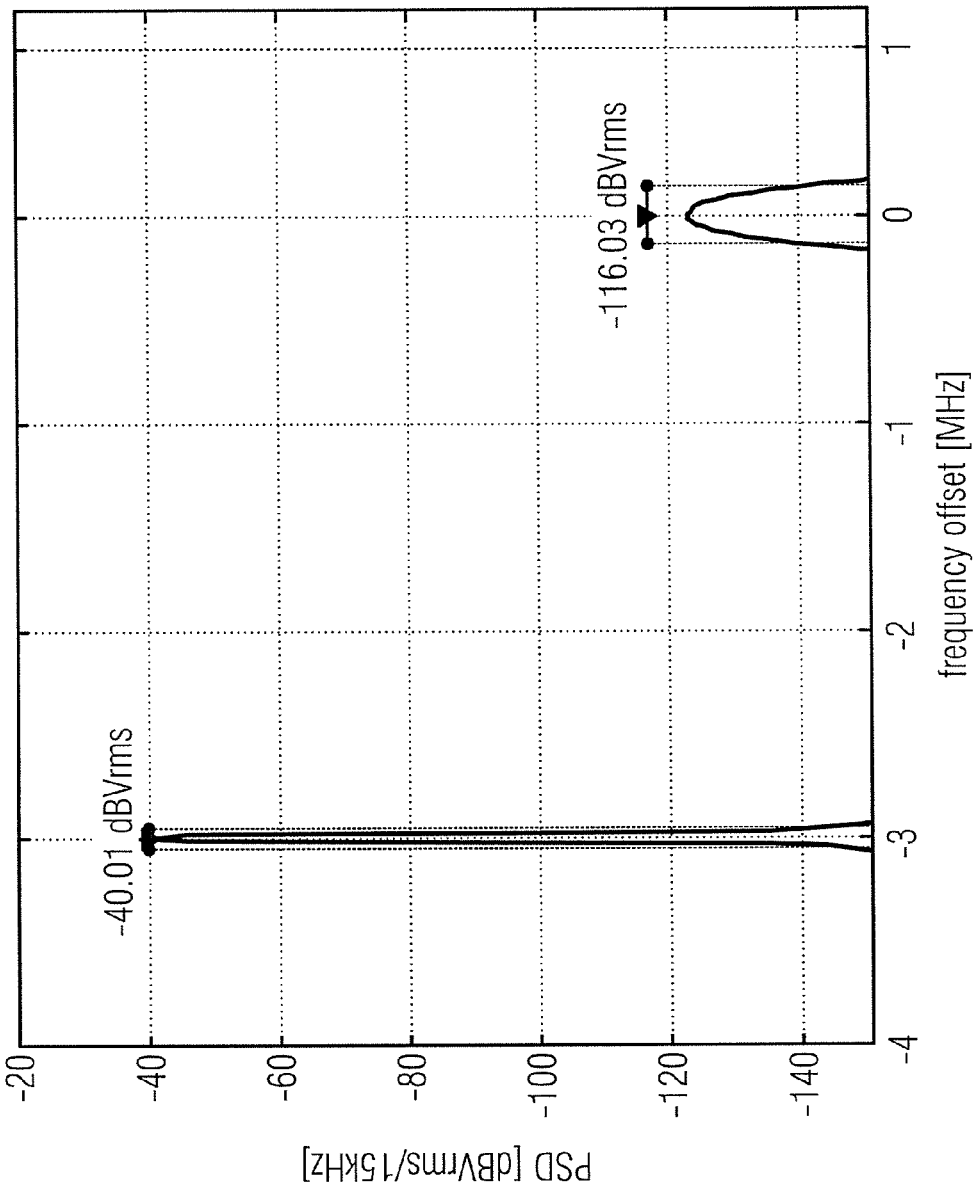
FIG. 4 illustrates a power spectral density according to a test specification of the so called 3 MHz blocker test case.

In FIG. 1, a standard multi-mode, multi-band cellular receiver technology is shown in schematic block diagram form. The receiver topology comprises a RF-frontend (low noise amplifier, mixer, and passive pole) and a base band filter ($1^{st}$ pole and biquad), a programmable gain control (PGC), and a continuous-time sigma-delta modulator (CT-SD ADC). The RF-frontend has to fulfill at the same time opposed requirements. On one hand it has to provide high gain to reduce the contribution of successive blocks, like base band filter, PGC, and ADC, to the overall noise figure. On the other hand, too much gain may lead to headroom and linearity problems in mixer and 1st pole. In addition, the 3GPP (3rd Generation Partnership Project) specification requires new receiver features like four channels in HSDPA (High-Speed Downlink Packet Access) and carrier aggregation. The feature leads to four receiver paths with I/Q $1^{st}$ poles and each $1^{st}$ pole is differently implemented. Thus, a $1^{st}$ pole capacitance of assumed 200 pF is 16 times applied, which leads to a total receiver capacitance of 16×200 pF=3.2 nF. The size of the $1^{st}$ pole is mainly determined by the minimum transmit signal/blocker frequency, mixer peak current, and the supply voltage. The supply voltage decreases in 28 nm, 22 nm, 14 nm and smaller CMOS (Complementary Metal Oxide Semiconductor) technologies, which tighten the headroom/noise problematic and lead to a further increase of the $1^{st}$ pole capacitance. For a GSM/EDGE supporting receiver, the 3 MHz blocker test case shown in FIG. 4 is decisive for the $1^{st}$ pole capacitance. If the receiver is used in a data modem application like an UMTS/LTE stick (UMTS: "Universal Mobile Telecommunications System", LTE: "Long-Term Evolution"), the $1^{st}$ pole capacitance is defined by the reference sensitivity LTE 10 band 17 depicted in FIG. 3.

Figure 2:
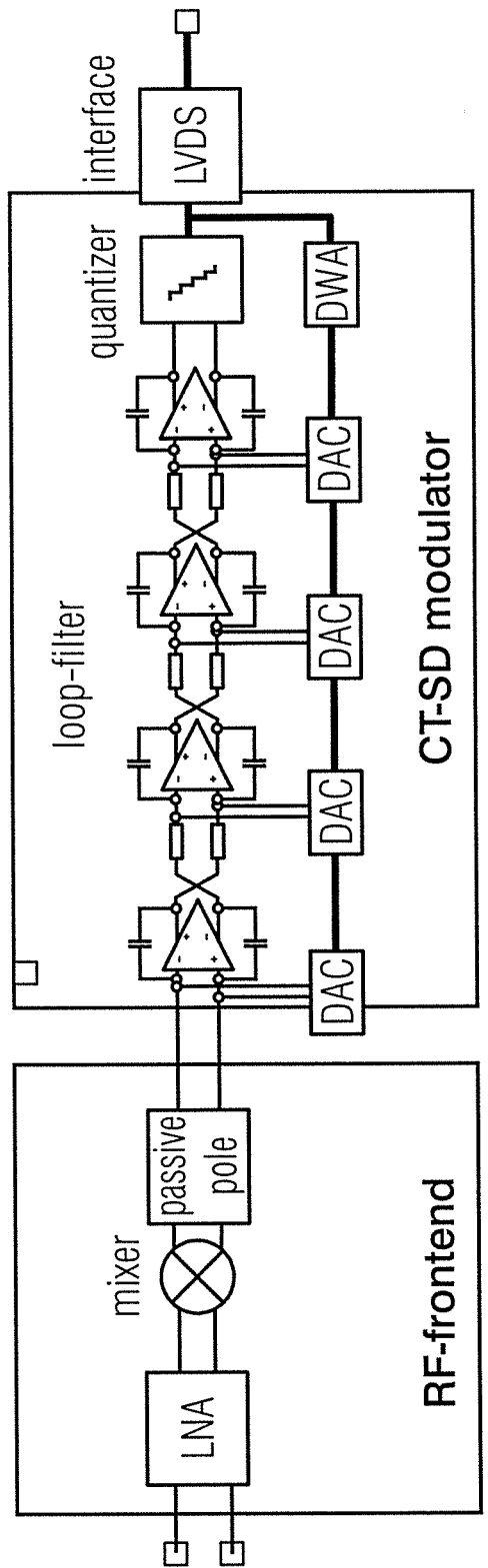
FIG. 2 shows a schematic block diagram of a continuous-time sigma-delta analog-to-digital converter topology that is based on analog signal transfer function filtering (STF-filtering)

FIG. 2 shows a schematic block diagram of a signal transfer function-filtering (STF-filtering) based CT-SD ADC topology. This topology suffers from the headroom problematic, as well. It is only shifted to the first integrator. Therefore, analog filtering-based technologies as depicted in FIG. 1 and FIG. 2 are suffering from capacitance increase over the shrink-path (i.e., the evolution to 14 nm CMOS technologies and smaller CMOS technologies). Thus, the technologies illustrated in FIGS. 1 and 2 appear to be limited with respect to their suitability for deep sub-micron CMOS technologies.

A current solution to this problem consists in reducing the gain in the LNA mixer to arrive with less mixer peak-current, and in increasing the capacitance at the first pole or first integrator to adjust the swing to lower supply voltage. These measures lead to less receiver sensitivity and larger area requirements due to larger capacitances.

Figure 5:
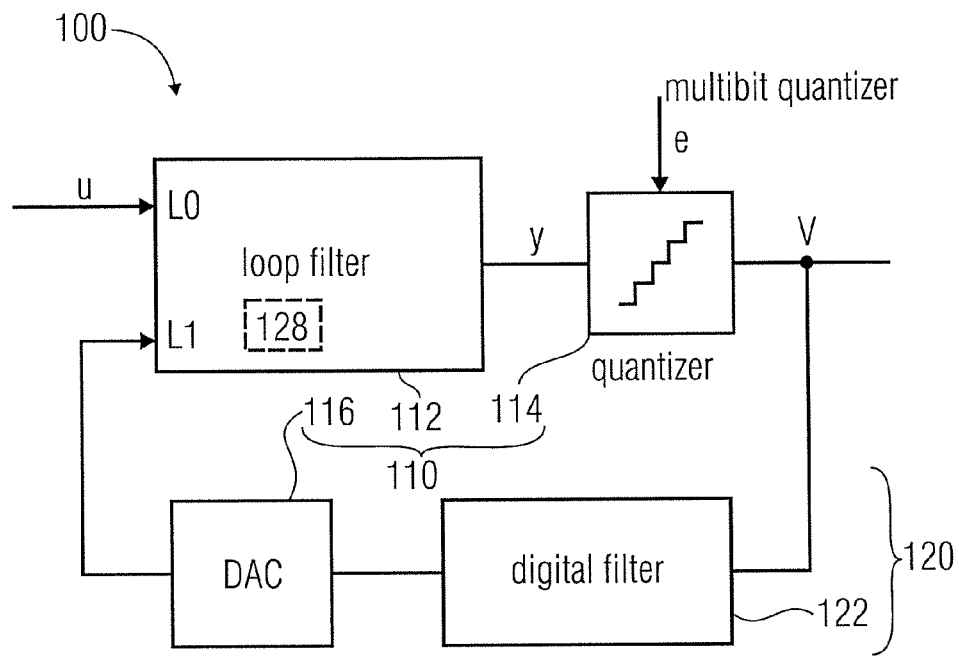
FIG. 5 shows a schematic diagram of a continuous-time sigma-delta modulator with digital filter in the feedback path according to embodiments of the teachings disclosed herewith.

The swing at the input of the first integrator in the continuous-time sigma-delta modulator in the RF-ADC receiver topology shown in FIG. 2 is defined by the transmit signal/blocker signal in a plurality of possibly occurring operating conditions. According to one aspect of the teachings disclosed herein, the first STF filtering pole may be shifted to higher frequencies in order to reduce the size of the first integrator capacitance. The now missing receiver selectivity is compensated by an additional digital filter between the quantizer and a digital-to-analog converter (DAC) that is part of a feedback loop. FIG. 5 shows a schematic block diagram of an analog-to-digital converter 100 according to embodiments of the teachings disclosed herein. An analog input u is received at an input L0 of a loop filter 112 of a sigma-delta modulator 110. The analog input signal u is combined with a cancellation signal by means of a signal combiner 128 within the loop filter 112. At an output of the loop filter 112, a filtered version v of the combined signal (i.e., the signal obtained by combining the analog input signal u and the cancellation signal) is provided to an input of a quantizer 114 that is also part of the sigma-delta modulator 110. In the embodiment shown in FIG. 5, the quantizer 114 is a multi-bit quantizer. A quantization error introduced by the quantizer 114 is indicated by a quantization error signal e that forms another (imaginary) input to the quantizer 114. At the output of the quantizer 114 a multi-bit digital signal v is obtained that forms the digital modulator output signal in the embodiment shown in FIG. 5.

The analog-to-digital converter 100 shown in FIG. 5 further comprises an interference cancellation loop 120 which, in the depicted embodiment, coincides with a feedback loop of the sigma-delta modulator 110. The sigma-delta modulator 110 comprises a digital-to-analog converter 116. An output of the digital-to-analog converter 116 is connected to an input $L_1$ of the loop filter 112. As the feedback loop of the sigma-delta modulator 110 and the interference cancellation loop 120 coincide in the embodiment illustrated in FIG. 5, the digital-to-analog converter 116 may be assigned to both, the feedback loop and the interference cancellation loop 120.

The digital-to-analog converter 116 receives a filtered digital signal at its input that is provided by a digital filter 122, which is part of the interference cancellation loop 120. The digital filter 120 is configured for relatively amplifying the sigma-delta output signal v in a (specific) frequency band. Outside this frequency band and also outside a transition band surrounding the frequency band, the digital filter 122 is configured for relatively attenuating the sigma-delta output signal v. The expressions "relatively amplifying" and "relatively attenuating" indicate that the sigma-delta output signal is relatively amplified within the frequency band, compared to outside the frequency band (but not necessarily absolutely amplified). The mentioned frequency band may be a finite frequency band, i.e., a lower limit and an upper limit of the frequency band is unequal to zero and also unequal to infinity. This condition may be expressed as $0 < f_{lower}$ and $< f_{upper} < \infty$. Hence, the digital filter 122 may have a bandpass-like frequency response, or it may be implemented as a digital bandpass filter according to appropriate design techniques for digital bandpass filters. Note that such a digital bandpass filter is not necessarily an ideal bandpass, which would perfectly suppress the signals outside its passband. Rather, the digital filter 122 may have a non-zero frequency behavior outside the passband, because at least in some embodiments of the teachings disclosed herein, a perfect suppression of the signal outside the passband may neither be necessary nor desirable. A more precise description of the required filter function may be called "band enhancement" or "band emphasis", i.e., a (possibly constant) non-zero transfer function outside a passband and relative thereto an enhancement within the frequency band (passband). Accordingly, the digital filter 122 may also be regarded as a band-enhancement filter or a band-emphasis filter.

In the embodiment shown in FIG. 5, the signal combiner 128 may be attributed to both, the feedback loop of the sigma-delta modulator 110 and to the interference cancellation loop 120, due to the feedback loop and the interference cancellation loop coinciding in this embodiment.

Figure 6:
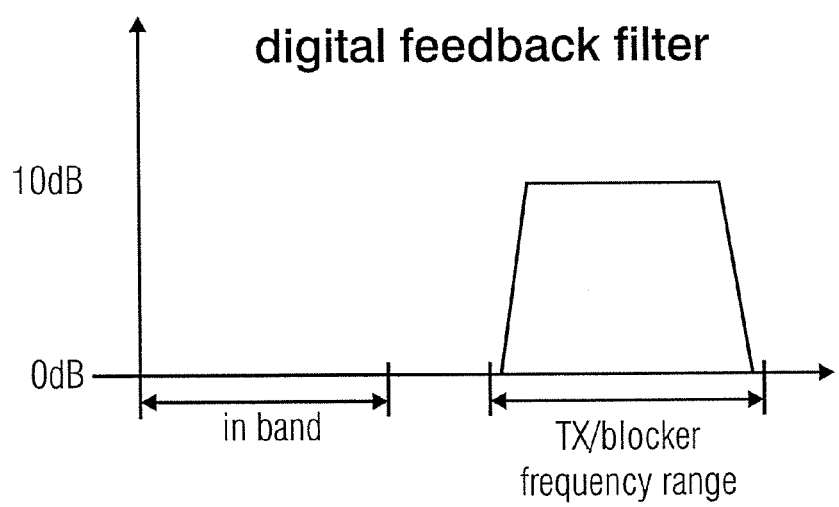
FIG. 6 illustrates the frequency response of the digital feedback filter in FIG. 5.

In FIG. 6 the digital filter characteristic of the digital filter 122 in FIG. 5 is shown. The digital filter characteristic has an in-band gain of 0<dB and in the transmit signal/blocker frequency range a gain of 10 dB. This 10 dB gain leads to increased STF filtering selectivity in the transmit signal/blocker frequency range. The signal transfer function STF(z) and noise transfer function NTF(z) are given in equations (1) and (2).

$$STF = \frac{L_0}{1 - L_1 F_d} \quad (1)$$

$$NTF = \frac{1}{1 - L_1 F_d} \quad (2)$$

In the equations (1) and (2) $L_0$ refers to the transfer function of the loop filter 112 between its input $L_0$ and its output, and $L_1$ refers to the transfer function of the loop filter 112 between its input $L_1$ and its output. The symbol $F_d$ designates the signal transfer function of the feedback loop.

The digital filter 122 could simply be implemented by two poles and two zeros. The STF-filtering characteristic may be digitally improved with the additional digital filter, but in this case the loop stability typically is slightly degraded, as well. The numerical operations in the digital filter lead to an increased DAC-requirement up to 20 bits for the mobile communication standard LTE20.

The frequency band of the digital filter 122 corresponds to the frequency portion of the filter characteristic in FIG. 6 where the gain of the digital feedback filter is (at least approximately) equal to 10 dB. The transition band corresponds to the two sections of the filter characteristic to the left and to the right of the frequency band. Thus, the gain decreases from 10 dB to 0 dB within the transition band. The frequency band of the digital filter 122 is within a frequency range of an expected interference signal or a plurality of expected interference signals according to FIG. 6. In the alternative, the frequency band of the digital filter 122 may comprise or overlap the frequency range(s) of the expected interference signal(s).

Moreover, FIG. 6 illustrates that the digital filter 122 relatively attenuates the sigma-delta output signal v in an in-band frequency range of the input signal u and relatively amplifies the sigma-delta output signal v in an out-of-band frequency range of the input signal.

The schematic block diagram of FIG. 5 may also be regarded as a signal processor comprising a forward signal processing path and a feedback signal processing path. The forward signal processing path comprises a sigma-delta modulator 110. The feedback signal processing path 120 comprises a digital controller 122 for conditioning a modulator output signal v and feeding a resulting cancellation signal to an input $L_1$ of the forward signal processing path for selective cancellation of signal portions of an input signal u for the signal processor 100. The digital controller 122 has a (frequency) characteristic for emphasizing an out-of-band frequency range, so that feeding the resulting cancellation signal to the input $L_1$ of the sigma-delta modulator 110 reduces out-of-band signal portions within the out-of-band frequency range of the input signal u of the signal processor.

The sigma-delta modulator 110 may be configured for receiving an analog modulator input signal u. The modulator output signal v may be a digital signal.

The schematic block diagram of FIG. 5 may also be regarded as an analog-to-digital converter 100 that comprises:

a means 128 for combining the input signal u with a cancellation signal and for providing a corresponding modulator input signal;

a means 110 for sigma-delta modulating the modulator input signal and for providing a sigma-delta modulator signal v;

a means for filtering the sigma-delta modulator signal v in a frequency band and for relatively attenuating the sigma-delta output signal outside the frequency band and a transition band surrounding the frequency band to obtain a filtered sigma-delta modulated signal; and a means 116 for digital-to-analog-converting the filtered sigma-delta modulated signal to obtain the cancellation signal.

Figure 7:
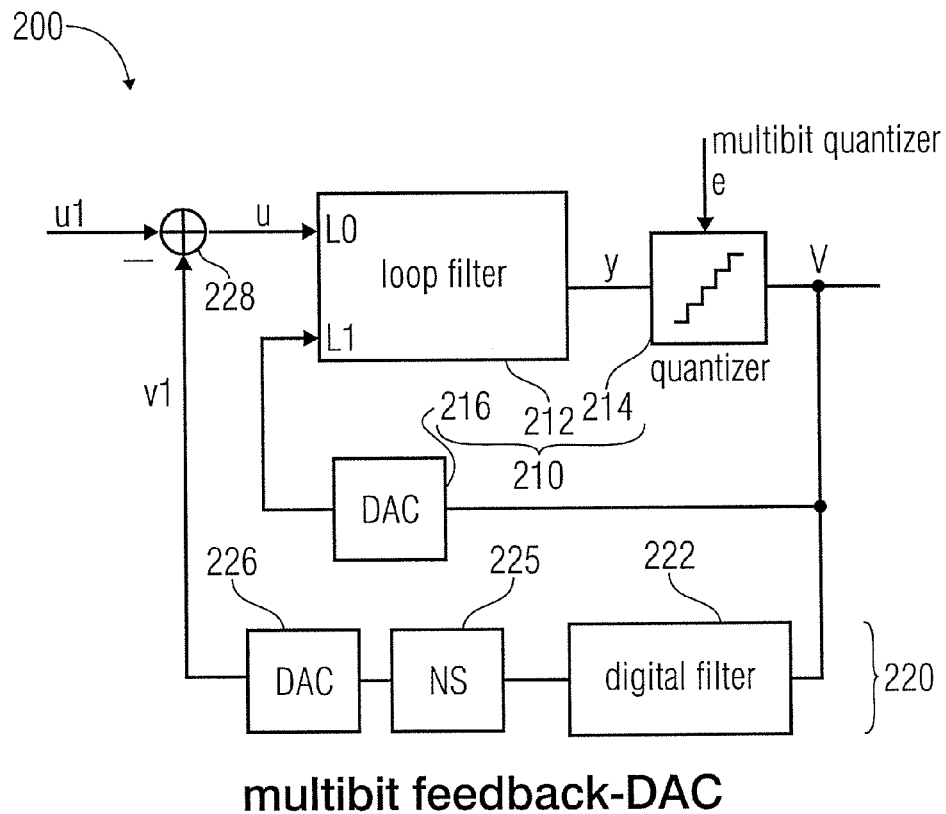
FIG. 7 shows a schematic block diagram of a continuous-time sigma-delta modulator with an additional control loop according to embodiments of the teachings disclosed herein.

A more advanced idea is to build a digital transmit signal/blocker cancellation loop around a core sigma-delta modulator, which subtracts the transmit signal/blocker signal in front of the core sigma-delta modulator. This approach is depicted in FIG. 7. The analog-to-digital converter 200 illustrated in schematic block diagram form in FIG. 7 comprises the sigma-delta modulator 210 and the interference cancellation loop 220. The sigma-delta modulator 210 comprises the loop filter 212, the multi-bit quantizer 214, and the digital-to-analog converter 216. The interference cancellation 220 comprises the digital filter 222, a digital noise filter 225, a (further) digital-to-analog converter 226, and a signal combiner 228. The analog-to-digital converter 200 receives the input signal u1, which is then combined with the cancellation signal v1 by the signal combiner 228 of the interference cancellation loop 220. The signal combiner 228 is implemented as a subtractor in the embodiment illustrated in FIG. 7. The combination of the input signal u1 and the cancellation signal v1 yields an analog modulator input signal u, which is provided to the input L0 of the loop filter 212. The sigma-delta modulator 210 of the embodiment shown in FIG. 7 is largely similar to the analog-to-digital converter 100 illustrated in FIG. 5. A difference is that the feedback loop of the sigma-delta modulator 210 does not comprise a digital filter between the quantizer 214 and the digital-to-analog converter 216. Nevertheless, it is conceivable that the feedback loop of the sigma-delta modulator 210 does comprise a digital filter in the feedback loop.

As mentioned above in the context of FIG. 5, the digital filter 222 relatively amplifies the sigma-delta output signal v in a (specific) frequency band and relatively attenuates the sigma-delta output signal v outside this frequency band and a transition band associated with the frequency band (i.e., typically surrounding and/or being adjacent to the frequency band). A corresponding filtered digital feedback signal is provided at an output of the digital filter 222.

To summarize the above, the core sigma-delta modulator 210 comprises the loop filter 212, the quantizer 214, and the feedback DAC 216, while the digital control loop (interfering cancellation loop) 220 comprises the digital (control) filter 222, the noise shaper (NS) 225, and an additional transmit signal/blocker cancellation DAC 226.

Figure 8:
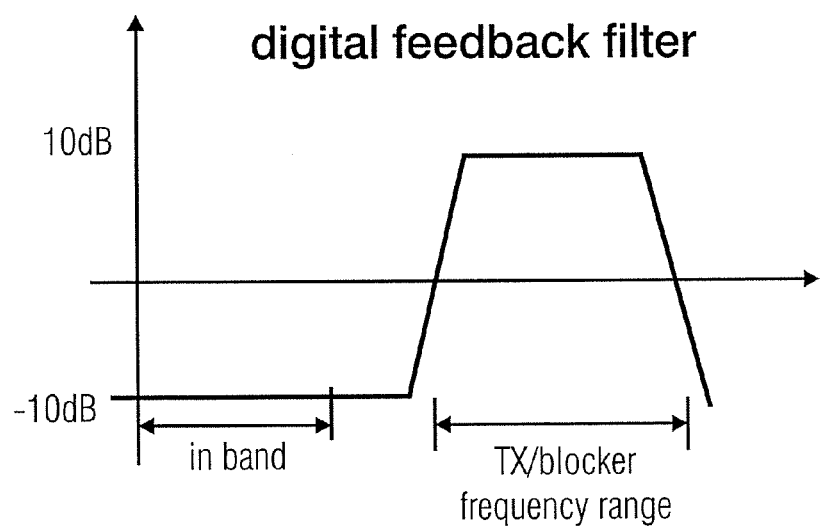
FIG. 8 illustrates the frequency response of the digital control filter in FIG. 7 as an example of an ideal digital control loop filter.

The digital control filter has an in-band gain of −10 dB and in the transmit signal/blocker frequency range a gain of +10 dB as illustrated in FIG. 8. In comparison to the digital filter 122 in the sigma-delta loop approach illustrated in FIG. 5, the desired in-band signal u1 passes the signal combiner 228 substantially unchanged due to −10 dB in-band gain in the interference cancellation loop 220 and is thus forwarded to the input L0 of the core sigma-delta modulator 210.

In contrast, all signals in the transmit signal frequency range are suppressed by the action of the 10 dB control filtering gain in the transmit signal/blocker frequency range and the signal combiner 228.

In equation (3) the impact of the control loop filter 222 on the overall STF is calculated:

$$STF_{overall} = \frac{STF}{1 + STF \cdot H(z)} \quad (3)$$

wherein $H(z)$ is the frequency response of the control loop filter 222. It can be seen that for frequency ranges in which $H(z)$ is small, the overall signal transfer function $STF_{overall}$ is approximately equal to the signal transfer function STF of the core sigma-delta modulator 210. On the other hand, in frequency ranges in which the frequency response $H(z)$ of the control loop filter 222 is large, the denominator of the fraction in equation (3) is larger than the numerator, so that the overall signal transfer function $STF_{overall}$ will become relatively small in this frequency range. The transmit signal frequency range is typically well-known in frequency division duplex systems and it depends on the used band and standards. An example for a transmit signal with a frequency range from 26 MHz to 35 MHz relative to the desired reception signal is depicted in FIG. 3. In contrast, in time division duplex (TDD) systems like DSM/EDGE the blocker frequency can be in a frequency range from 3 MHz to 100 MHz, but the frequency is unknown. In this case, the digital filter 222 may be adjusted to a frequency range from 3 MHz up to 20 MHz to relax attenuation requirements in the first integrator of the core sigma-delta modulator 210. This relaxation of the attenuation requirements in the first integrator reduces the required capacitance to be provided for the first integrator. The mentioned digital filter may be a digital resonator in a simple case.

A major digital control filter design requirement is control loop stability. The digital control filter input requires the same bus width as the core sigma-delta modulator output, but the output of the digital control filter 222 needs to have significantly increased bus width due to the signal processing to be performed, in order to avoid truncation errors. This may lead to DAC resolutions of up to 20 bit in the mobile communication standard LTE20, for example. To address this problem, a digital noise shaper 225 may be introduced to enable a low resolution DAC 226 for transmit signal/blocker cancellation. The high-frequency shaped quantization noise produced by the interference cancellation loop DAC 226 is filtered by the modulator STF to maintain the performance. Hence, the interference cancellation loop 220 may comprise the digital noise shaper 225 somewhere between an output of the sigma-delta modulator 210 and the digital-to-analog converter 226.

Figure 9:
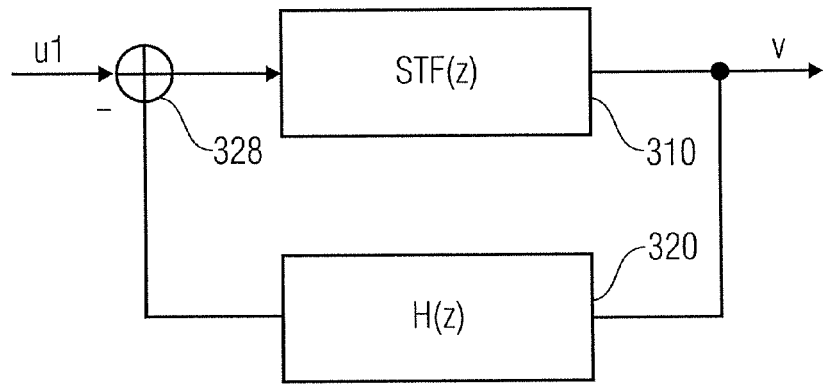
FIG. 9 illustrates in schematic block diagram-form a linear z-domain model of a sigma-delta modulator with control loop according to embodiments of the teachings disclosed herein.

FIG. 9 shows a schematic block diagram of an analog-to-digital converter according to the teachings disclosed herein in a generalized form. In FIG. 9 the analog input signal is designated by u1 and the digital output signal is designated by v. The block 310 in the forward signal path of the analog-to-digital converter corresponds to a sigma-delta modulator with a signal transfer function STF(z). In the feedback path the analog-to-digital converter comprises a digital controller or digital filter 320 with the transfer function H(z). Thus, FIG. 9 shows a linear z-domain model of the sigma-delta modulator 310 with the control loop 320. The overall signal transfer function of this linear z-domain model has already been discussed above in the context of equation (3). The signal combiner 328 that combines the input signal u1 with an output of the control loop 320 (i.e., a cancellation signal) is implemented as a subtractor in this embodiment. As the input signal u1 is an analog signal, the output of the control loop 320 typically is an analog signal, too. Accordingly, the signal combiner 328 typically is an analog signal combiner.

An enhancement of the technique discussed above is shown in FIG. 10 as a further possible embodiment of an analog-to-digital converter 400 according to the disclosed teachings. The analog-to-digital converter 400 comprises a continuous-time sigma-delta modulator 410 and a digital transmit signal/blocker cancellation control loop 420. In addition, the analog-to-digital converter 400 comprises a digital replica 432 of the signal transfer function STF of the sigma-delta modulator 410 for processing a digital noise shaper output signal, i.e., an output signal of the digital noise shaper 225. The digital replica 432 provides a STF-replica signal that is combined with the core sigma-delta output signal v by means of a digital subtractor 434 to produce an output signal w of the overall analog-to-digital converter 400. The STF replica output signal substantially matches or is similar to the core sigma-delta output signal, but it is negative. With the help of the STF(z) replica block 432, the behavior of the core sigma-delta modulator 410 without the digital transmit signal/blocker cancellation control loop 420 is reconstructed. Thus, the core sigma-delta modulator 410 does not have to process the transmit signal/blocker signal anymore, but the digital output signal w of the analog-to-digital converter 400, nevertheless, contains the reconstructed transmit signal/blocker signal. Therefore, the bus width has to be increased for the digital output signal w, in contrast to the bus width of the core sigma-delta modulator output. For a core sigma-delta modulator with a flat in-band signal transfer function STF, the digital STF(z) replica 432 can be set to STF(z)=1. In this case however, the core sigma-delta STF reconstruction does not work correctly for the out-of-band frequency range. This approach may be used for applications where the out-of-band frequency range is not of interest.

Figure 10:
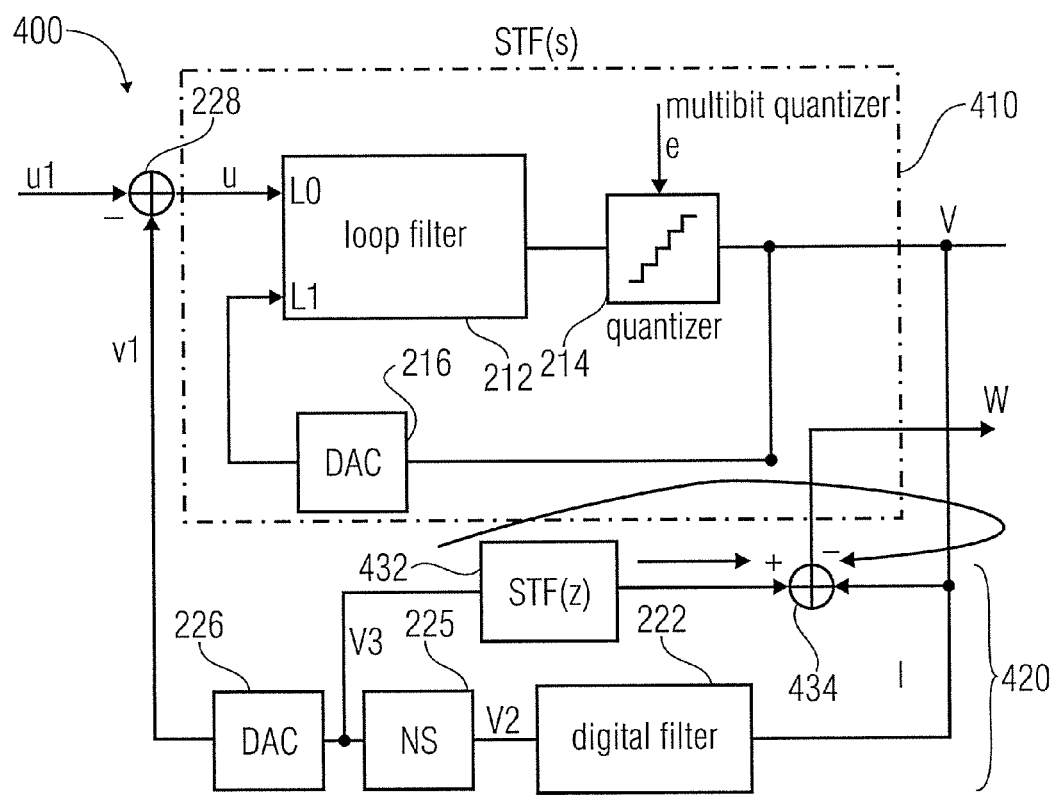
FIG. 10 shows a schematic block diagram of a sigma-delta modulator with controller and correction logic according to embodiments of the teachings disclosed herein.

According to what is illustrated in FIG. 10, the interference cancellation loop 420 comprises the digital replica 432 of the signal transfer function STF of the sigma-delta modulator 410. The digital replica 432 is configured to receive the filtered digital feedback signal v2 or a derived filtered signal v3 and to provide an estimator response of the signal-delta modulator 410 in response to the filtered digital feedback signal v2 or the derived filtered signal v3. The estimated response is added to, or combined with, the digital modulator output signal v or a derived modulator output signal to provide an output signal w of the analog-to-digital converter 400.

In alternative embodiments, the interference cancellation loop 420 may comprise a further digital replica of the signal transfer function STF of the sigma-delta modulator 410 and a further digital filter, wherein the further digital replica and the further digital filter are arranged in a cascaded arrangement with the digital replica 432 and the digital filter 222, so that a further estimator response provided by the further digital replica is combined with (e.g., added to or subtracted from) the digital modulator output signal v to provide the derived filtered signal for the digital filter. Furthermore, a further digital filter signal may be provided by the further digital filter which may then be combined with (e.g., added to or subtracted from) the digital filter signal to provide the cancellation signal v1. An example of a possible cascaded arrangement is shown in FIG. 40 and described in more detail below. The interference cancellation loop may comprise a cascaded arrangement of at least two feedback branches, each feedback branch comprising a digital filter and a digital-to-analog converter.

Figure 11:
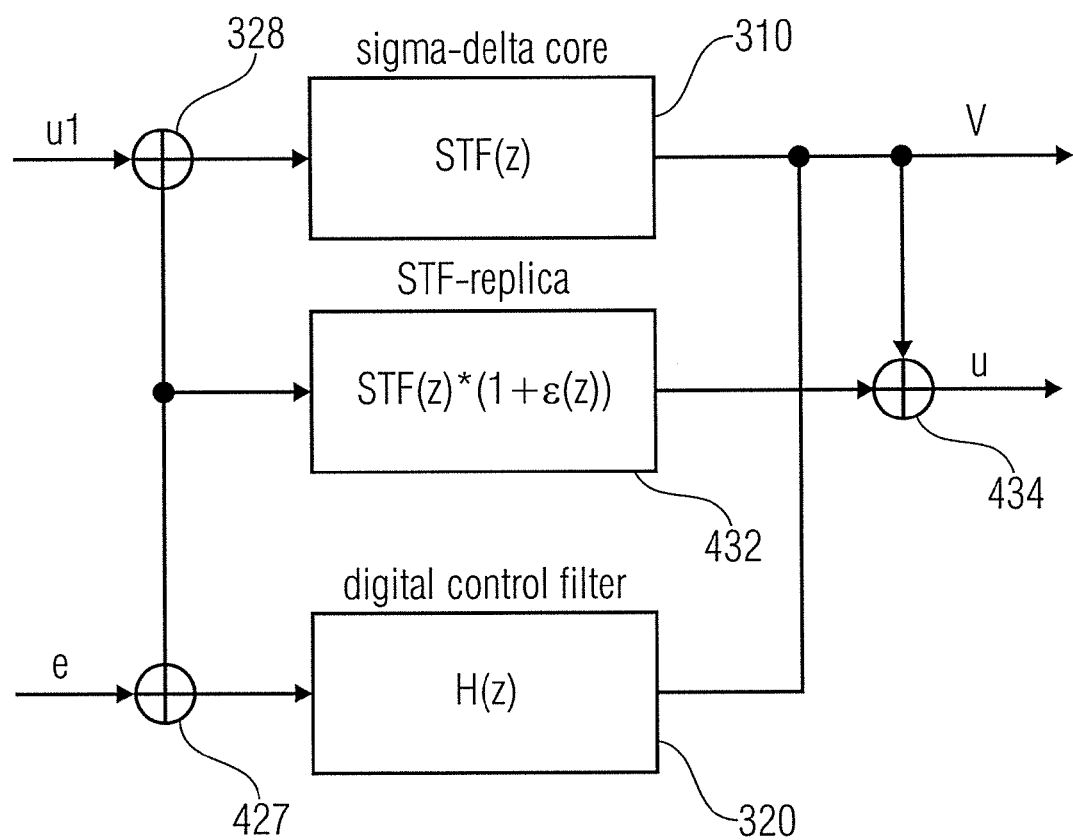
FIG. 11 illustrates in schematic block diagram-form a linear z-domain model of a sigma-delta modulator with a digital control loop.

The digital STF replica technique may also be used to correct round-off errors of the digital filter as depicted in FIG. 11. The schematic block diagram shown in FIG. 11 is based on the schematic block diagram of FIG. 9. In addition, the STF replica 432 and the digital signal combiner 434 are part of the analog-to-digital converter. The round-off errors are represented as a signal e, which is added to the signal generated by the digital control filter 320 by means of a (imaginary) signal combiner 427. The transfer function of the digital replica 432 may now be modeled as a convolution of the (estimated) signal transfer function STF(z) of the sigma-delta modulator 310 and the term $(1+\epsilon(z))$, where $\epsilon(z)$ is a z-domain model of the relative error e between the STF and STF replica caused by the digital control filter 320. With this novel technique, the digital noise shaper 225 is not required. The proposed technique is (only) limited by a mismatch between the actual signal transfer function STF(s) of the sigma-delta modulator 310 and the digital STF(z) replica 432. Moreover, the proposed technique may also be used to correct non-idealities in the interference cancellation DAC 226.

The digital noise shaper 225 and the digital control filter 222 may be realized as two different circuits. In the alternative, these two circuits may be combined in one single circuitry. The basic idea is to use a digital noise shaper topology and map a digital control filter behavior on the signal transfer function of the noise shaper. Using control filter coefficients in the noise shaper may be expected to lead to reduced noise shaping performance. Such reduced noise shaping performance may be compensated by an increased digital resolution (i.e., additional bits) in the transmit signal/blocker cancellation DAC 226. The input of the combined digital control noise shaper may have a quantizer bus width of about 3 bit/4 bit and may typically be equivalent to the core sigma-delta modulator bus width. The bus width of the output of the combined digital noise shaper and the transmit signal/blocker cancellation DAC 226 is defined by the overall performance requirement, in particular, a required signal-to-noise ratio (SNR). A benefit of using a delta structure in comparison to a delay structure for the digital combined control noise shaper is that round-off errors are less amplified than in the delay structure. Therefore, the delta structure can be expected to lead to smaller bus width in the implementation.

The proposed technique allows to optimize the analog noise shaper for signal-to-noise ratio and to implement the signal transfer filtering digitally. The proposed technique leads to lower order core sigma-delta modulators with lower area usage and power dissipation. The additional digital circuit is relatively insensitive to analog component variations, i.e., the additional digital circuit is robust in this respect. Furthermore, the additional digital circuit may be reconfigurable, i.e., during operation the signal transfer function may be digitally adaptable. Subsequent to a digital correction, a reconstructed signal transfer function STF of the core sigma-delta modulator may be used.

According to a majority of the embodiments of the teachings disclosed herein, a sigma-delta modulator is digitally improved with respect to its signal transfer function STF. Such digital improvement may involve a digital filter between the quantizer of the sigma-delta modulator and one or more digital-to-analog converter(s) used for feedback purposes. According to some embodiments, a separate digital filter may be provided for each feedback DAC. An analog-to-digital converter or signal processor according to the disclosed teachings may, in particular, comprise a transmit signal/blocker cancellation DAC with a digital control filter (the expression "transmit signal/blocker cancellation" may be construed as "transmit (TX) signal and/or blocker cancellation"). According to some embodiments, a special filter may be a digital STF reconstruction of the core sigma-delta modulator. With the help of the digital STF-reconstruction, more than one digital filter can be cascaded. The digital filter in the interference cancellation loop may be based on a filter design for a digital resonator, i.e., the digital filter may be designed and/or implemented as a digital resonator. The transmit signal/blocker frequency range may be reconfigured depending on the duplexer distance.

Figure 12:
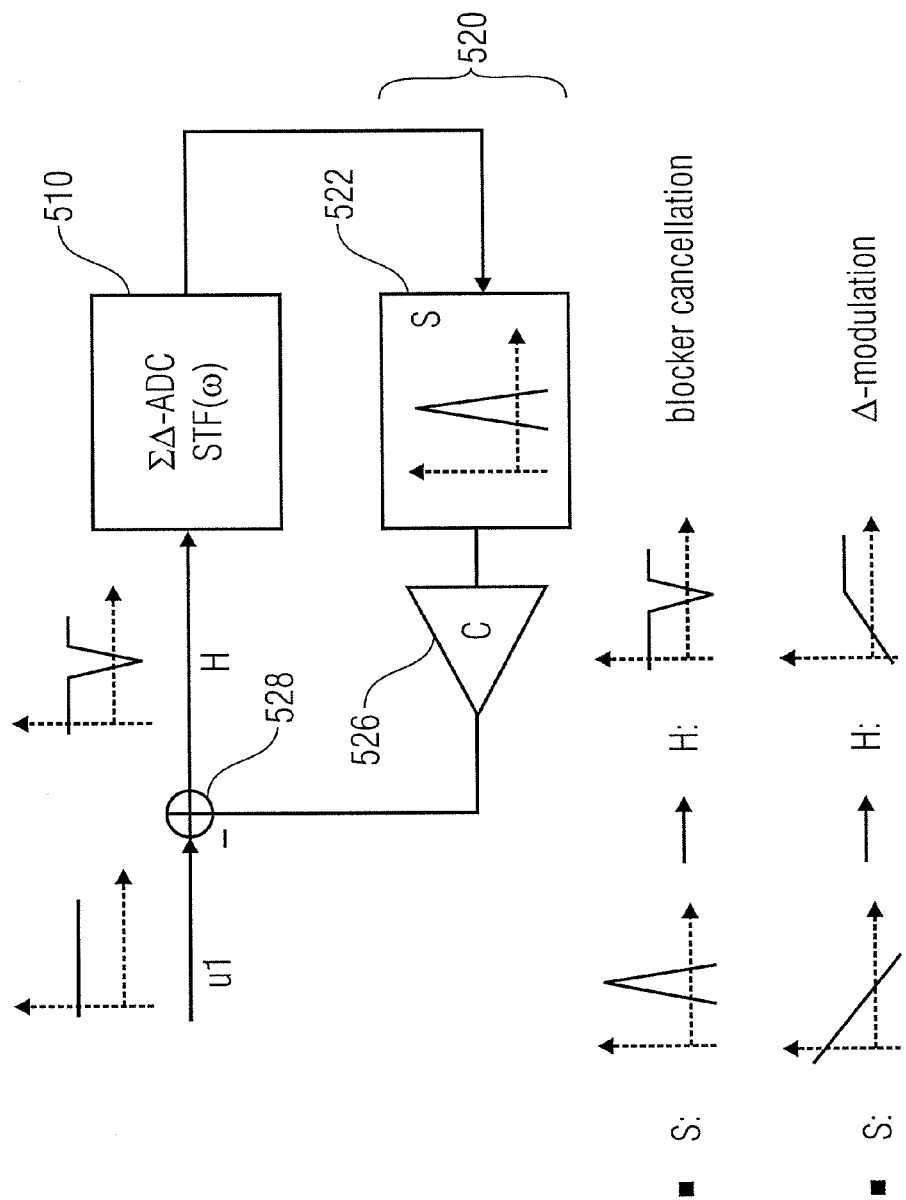
FIG. 12 shows a schematic block diagram of a sigma-delta analog-to-digital converter with a control loop and the effects of different controller characteristics to the input of the sigma-delta analog-to-digital converter.

FIG. 12 illustrates the effects of a controller in a feedback loop (interference cancellation loop) on the input of a sigma-delta modulator-based ADC. The analog-to-digital converter illustrated in FIG. 12 comprises the core sigma-delta modulator 510 and the feedback loop or interference cancellation loop 520. The interference cancellation loop 520 receives an output signal of the sigma-delta modulator 510 as an input and provides an output signal, which is subtracted from the input signal u1 for the overall analog-to-digital converter by means of a signal combiner (subtractor) 528. An output H of the signal combiner 528 is provided to an input of the core sigma-delta modulator 510. Accordingly, the signal H is the analog modulator input signal mentioned at various places throughout the description of the figures and the claims. The interference cancellation loop 520 comprises a digital filter 522 with a frequency response S. Furthermore, the interference cancellation loop 520 comprises a converter 526 (e.g., a digital-to-analog converter).

The input signal u1 is assumed to have a flat spectrum. For the purposes of a blocker cancellation, the frequency response S of the digital filter 522 is chosen to be bandpass-like. Accordingly, an output of the digital-to-analog converter 526 primarily comprises signal portions in the frequency band that corresponds to the passband of the digital filter 522. By correctly adjusting a phase shift of the interference cancellation 520, the output of the digital-to-analog converter 526 substantially cancels corresponding signal portions in the input signal u1, i.e., in the frequency range of the digital filter 522. This is illustrated in FIG. 12 by the schematic representation of the spectrum of the analog modulator input signal H.

For comparison, FIG. 12 also illustrates the situation for delta modulation in the lower part of FIG. 12. In this case, the frequency response S of the digital filter 522 is a lowpass filter. The combination of the input signal u1 with the cancellation signal provided at the output of the cancellation DAC 526 produces an analog modulator input signal H in which signal portions in a lower frequency range are suppressed.

Figure 13:
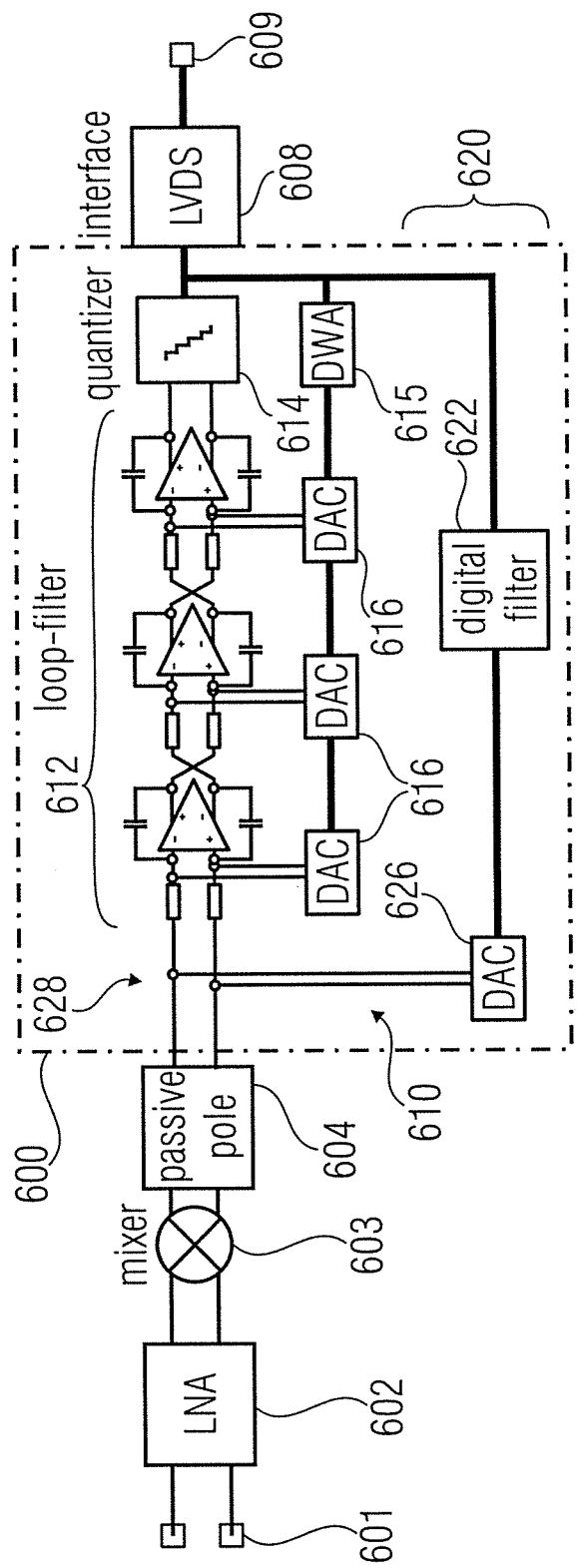
FIG. 13 shows a schematic block diagram of a receiver with a radio frequency (RF) analog-to-digital converter with digital transmit signal/blocker cancellation control loop.

FIG. 13 shows a schematic block diagram of an analog-to-digital converter 600 and additional circuitry that is typically employed in a receiver for wireless applications or mobile communications applications. Put differently, FIG. 13 shows a schematic block diagram of an RF-ADC receiver with digital transmit signal/blocker cancellation control loop. The schematic block diagram shown in FIG. 13 may also be considered as a signal processor 600 and additional circuitry, wherein the signal processor 600 comprises a forward signal processing path and a feedback signal processing path.

An antenna (not shown) may be connected to a pair of terminals 601. An antenna signal may then be amplified by a low noise amplifier (LNA) 602. A mixer 603 frequency-translates an amplified antenna signal provided by the low noise amplifier 602 from a radio frequency (RF) range to a baseband frequency range or an intermediate frequency (IF) range by means of a suitable local oscillator signal (not shown in FIG. 13). A passive pole filter 604 at an output of the mixer 603 removes intermodulation products of the filtering process, for example. Typically, the passband of the passive pole filter 604 is relatively wide so that the signal provided at an output of the passive pole filter 604 may typically still contain significant noise portions, interfering signal portions, and/or blocker signal portions outside a desired frequency range in which the desired signal to be received is present. The output of the passive pole filter 604 is connected to an input of the analog-to-digital converter 600. At an output side of the analog-to-digital converter 600, an interface 608 is provided which adapts the ADC output to a low voltage differential signal (LVDS) format. The signal provided by the LVDS interface 608 is then made available at a terminal 609 for further processing.

The sigma-delta modulator 610 comprises the loop filter 612, the quantizer 614, a data weighted average 615, and three digital-to-analog converters 616. The loop filter 612 comprises three stages, each stage having an operational amplifier-based filter. The interference cancellation loop 620 comprises the digital filter 622 and the digital-to-analog converter 626. The signal combiner 628 of the interference cancellation loop 620 is implemented as a simple junction of electrical conductors between the passive pole filter 604, the input of the loop filter 612, and the output of the DAC 626. Accordingly, a combination of the cancellation signal provided by the DAC 626 and the input signal provided by the output of the passive pole filter 604 occurs by summing the electrical currents provided by the two components.

Figure 14:
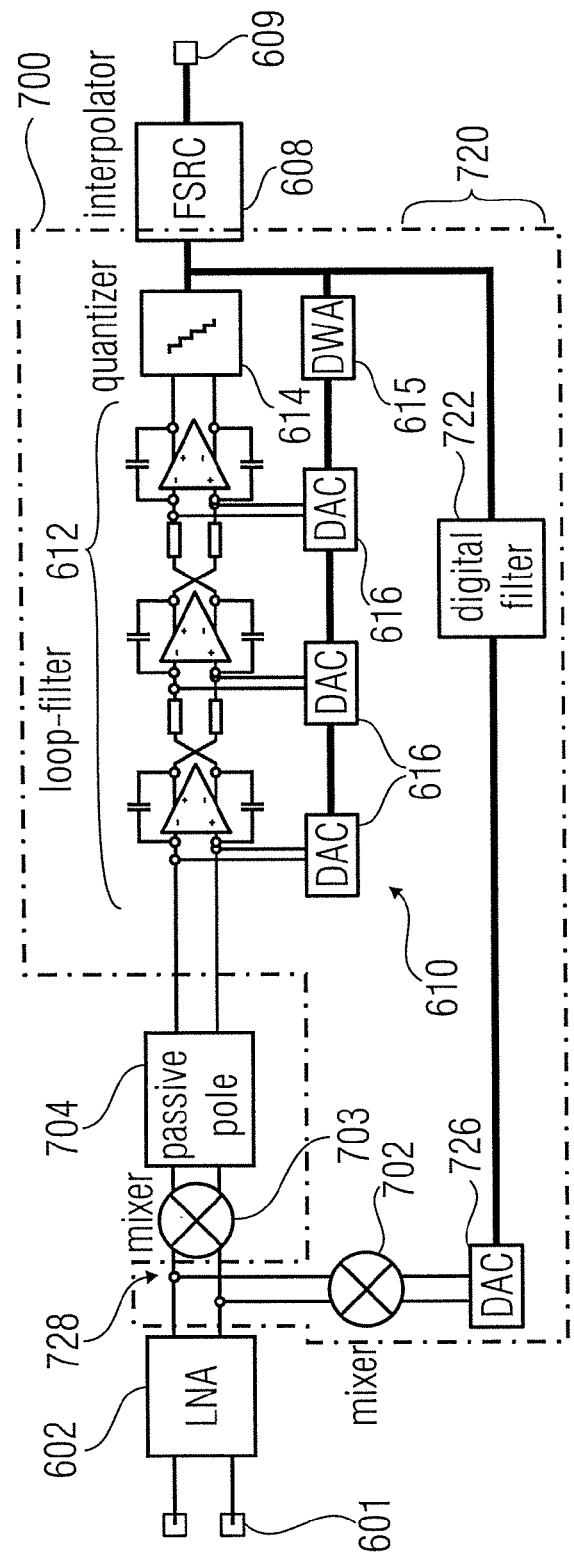
FIG. 14 shows a schematic block diagram of a receiver with frequency-translating RF analog-to-digital converter with digital transmit signal/blocker cancellation control loop.

FIG. 14 shows a schematic block diagram of a frequency-translation sigma-delta modulator with digital control filter and transmit signal/blocker cancellation RF-DAC. The arrangement shown in FIG. 14 may also be regarded as a frequency-translation (FT) RF-ADC receiver with digital transmit signal/blocker cancellation control loop.

The analog-to-digital converter 700 comprises a core sigma-delta modulator 610 similar to the sigma-delta modulator 610 of the embodiment shown in FIG. 13. Furthermore, the analog-to-digital converter 700 comprises an interference cancellation loop 720. The interference cancellation loop 720 comprises a digital filter 722, a digital-to-analog converter 726, a mixer 702, and a signal combiner 728. The mixer 702 receives an analog output signal provided by the digital-to-analog converter 726 and frequency-translates it to the RF-frequency range. The signal combiner 728 is interconnected between the low noise amplifier 602 and the mixer 703 of the main receive path. An interference signal that may be present in the reception signal received from the antenna via the terminal 601 and amplified by the low noise amplifier 602 may be substantially reduced by means of an interference cancellation signal injected to the main receive path between an output of the low noise amplifier 602 and input of the mixer 703. In this manner, the mixer 703 is not required to support a maximal amplitude at its input which may be mainly determined by an interfering signal in some operating conditions, such as a blocker signal or a crosstalk signal from a transmit path of a mobile communication device comprising the receiver schematically illustrated in FIG. 14.

An analog-to-digital converter according to the teachings disclosed herein may be used in a receiver application to improve the selectivity at the duplexer distances, i.e., the gap between a transmission frequency and a reception frequency of a radio transceiver (e.g., 190 MHz in the UMTS standard). According to one possible implementation which is provided as an example, the core sigma-delta modulator runs with a sampling rate of 900 MHz and a signal bandwidth of 9 MHz. The transmit signal/blocker cancellation is designed to suppress transmit/blocker signals between 30 MHz and 50 MHz by 10 dB.

Figure 15:
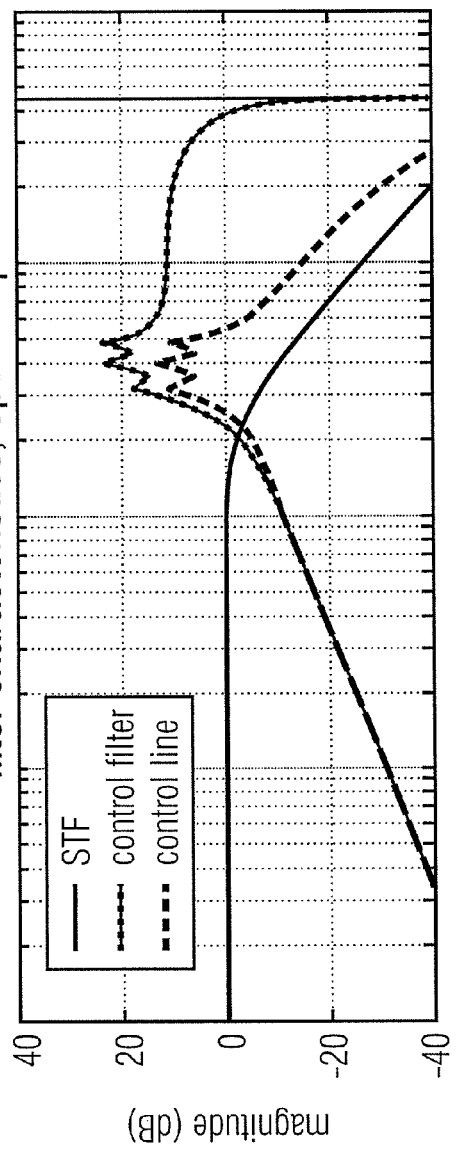
FIG. 15 illustrates open loop transfer functions of the sigma-delta modulator, of the control filter, and of the transmit signal/blocker cancellation control loop.
Figure 15:
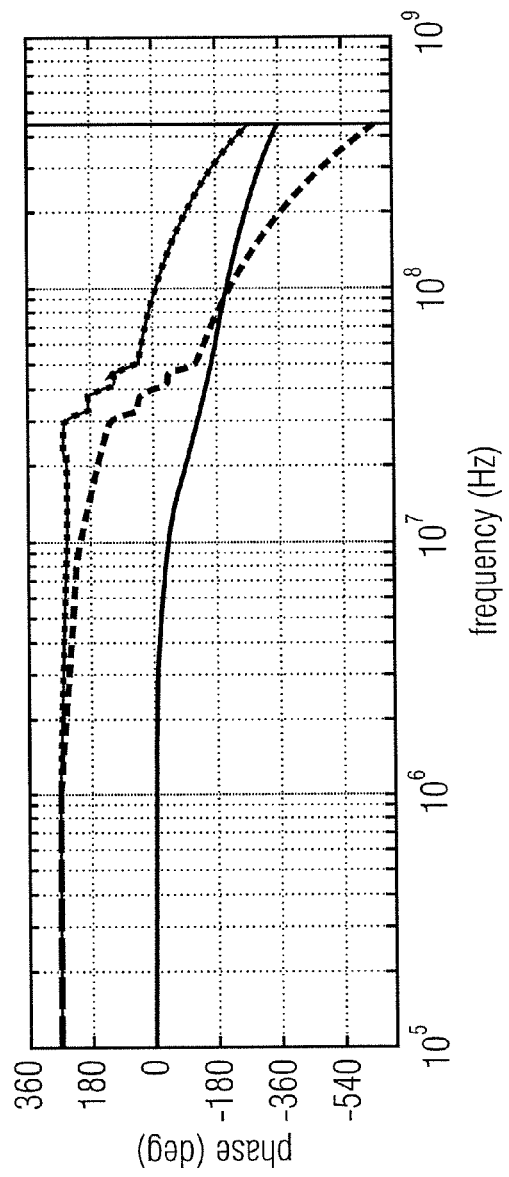

In FIG. 15 the signal transfer function STF of the core sigma-delta modulator, the transfer function of the digital control filter and the transfer function of the whole transmit signal/blocker cancellation control are depicted. Obviously, the signal transfer function STF of the core sigma-delta modulator suppresses signals between 30 MHz and 50 MHz already to some extend, namely by approximately 5 dB to 15 dB. The control filter, i.e., the digital filter 122, 222, 522, 622, or 722, has its maximum gain in this frequency range. Outside this frequency range of 30 MHz and 50 MHz, the gain of the control filter is substantially smaller. The combination of the core sigma-delta STF in series with the digital control filter has a gain greater than 1 in this desired frequency range and a gain smaller than 1 outside. As a rule of thumb, the suppression will be approximately 1/(1+gain) in the desired frequency range.

Figure 16:
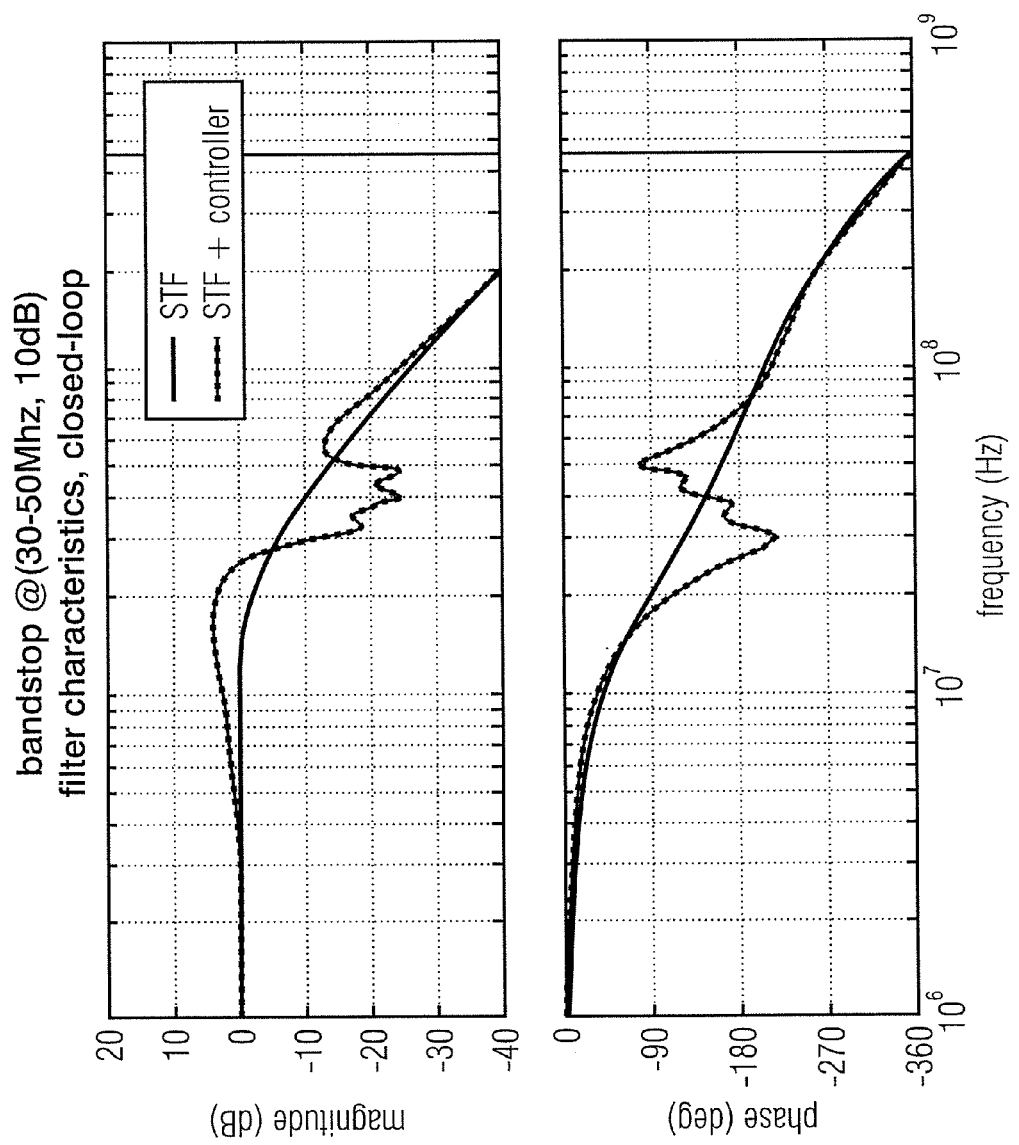
FIG. 16 illustrates a comparison of the signal transfer function of the core sigma-delta modulator with the signal transfer function of the sigma-delta modulator together with the transmit signal/blocker cancellation loop.

In FIG. 16 the transfer function of the closed loop system is shown. The full stroke curve (blue) is the signal transfer function STF of the core sigma-delta modulator and the dashed curve (green) is the closed loop STF of the digital control filter with the core sigma-delta STF, i.e., the closed loop STF of the interference cancellation loop combined with the core sigma-delta modulator. A comparison of the two curves shows that a signal transfer function obtained by using the digital correction method described above is approximately similar to the original signal transfer function, with the exception of the desired frequency range for interference cancellation, i.e., 30 MHz to 50 MHz. An additional signal suppression of about 10 dB can be seen in this frequency range. Furthermore, it can be seen that the closed loop STF of the interference cancellation loop combined with the core sigma-delta modulator is slightly above (i.e., has a higher gain than the original signal transfer function) the core sigma-delta modulator STF beneath the desired frequency range for interference cancellation.

Figure 17:
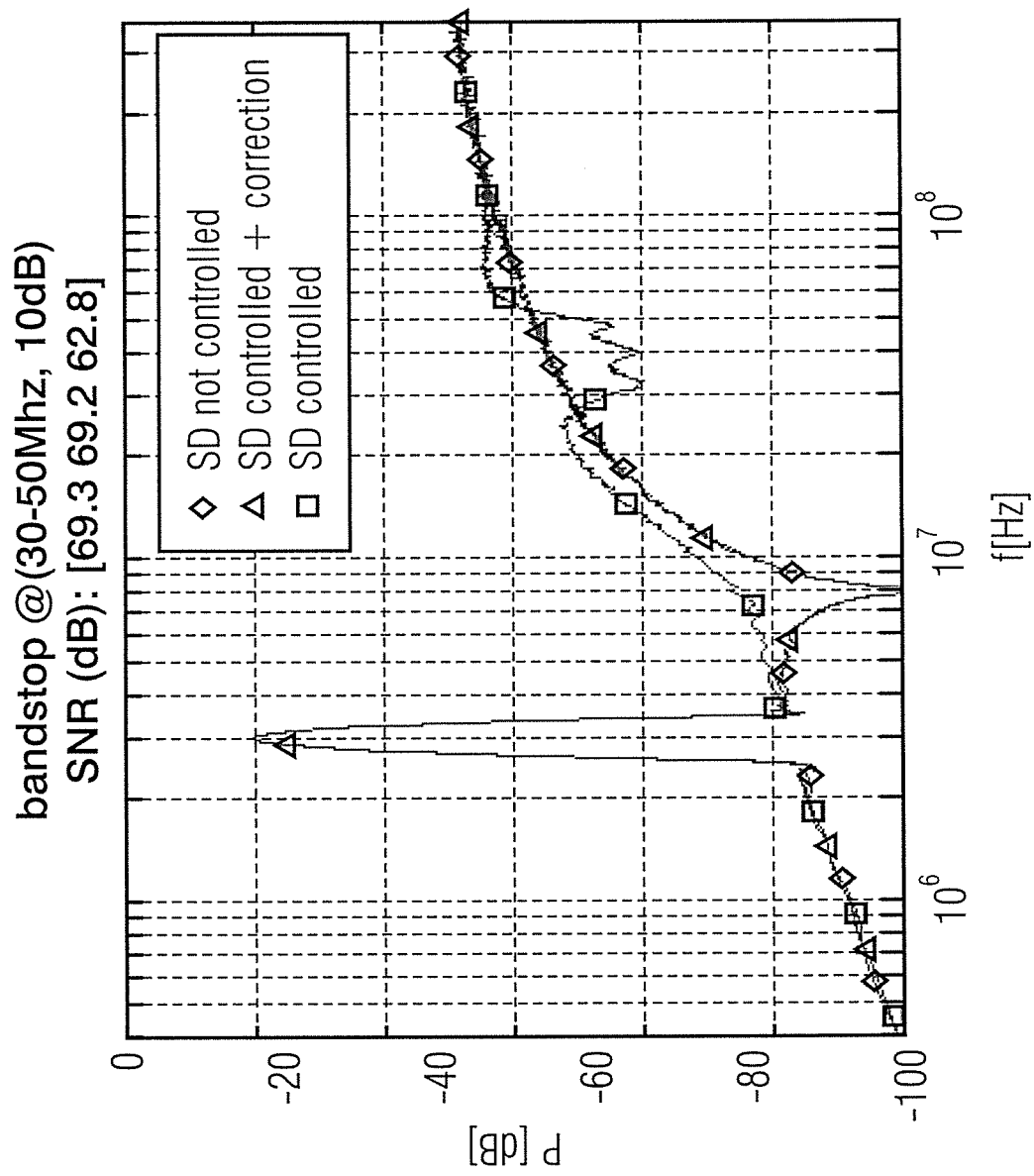
FIG. 17 shows frequency plots of the output signals of an uncontrolled sigma-delta modulator, a controlled-and-corrected sigma-delta modulator, and a controlled sigma-delta modulator in response to an input signal comprising a desired signal and noise, but no blocker signal.
Figure 18:
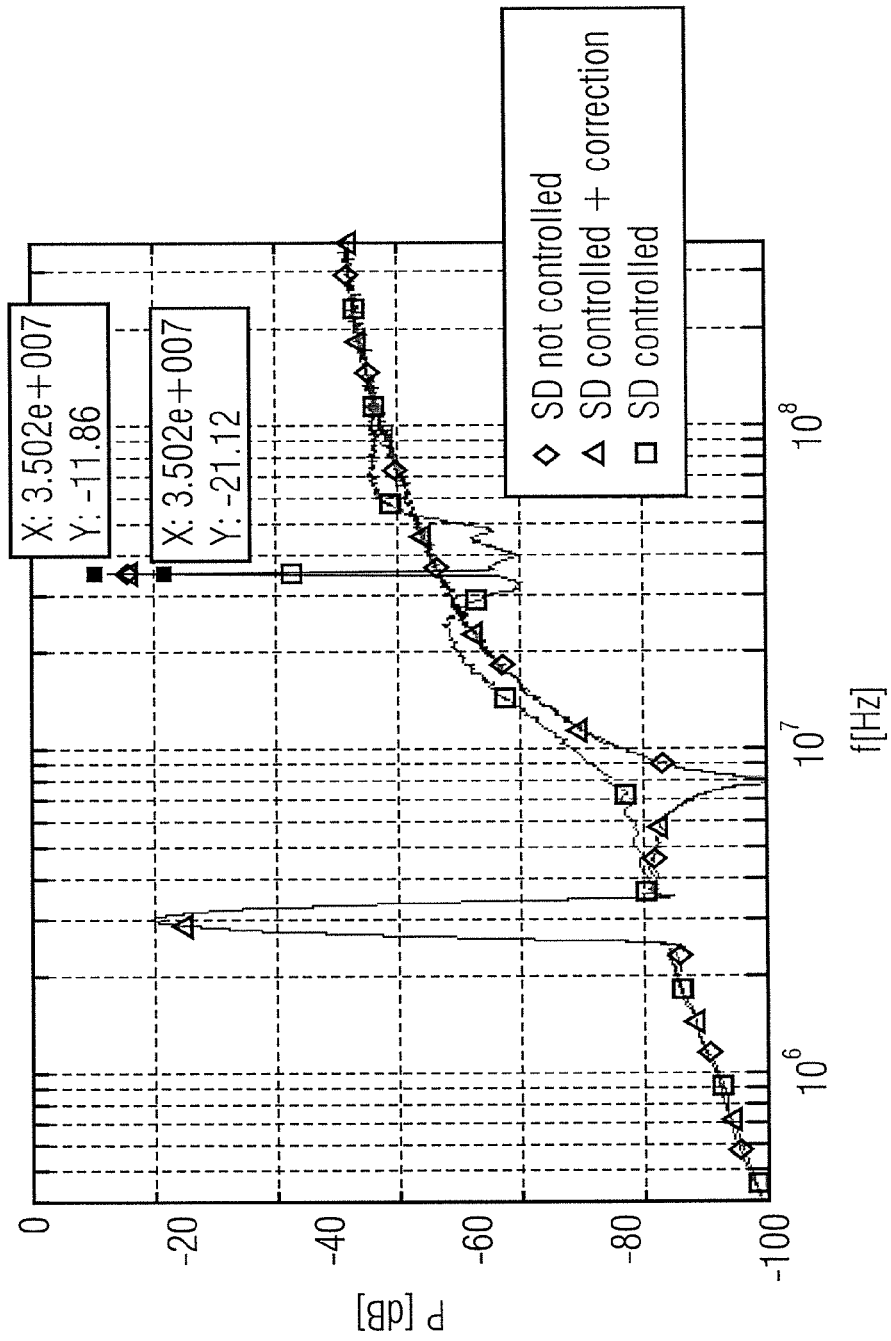
FIG. 18 is similar to FIG. 17 with the exception that the input signal further comprises the blocker signal.
Figure 19:
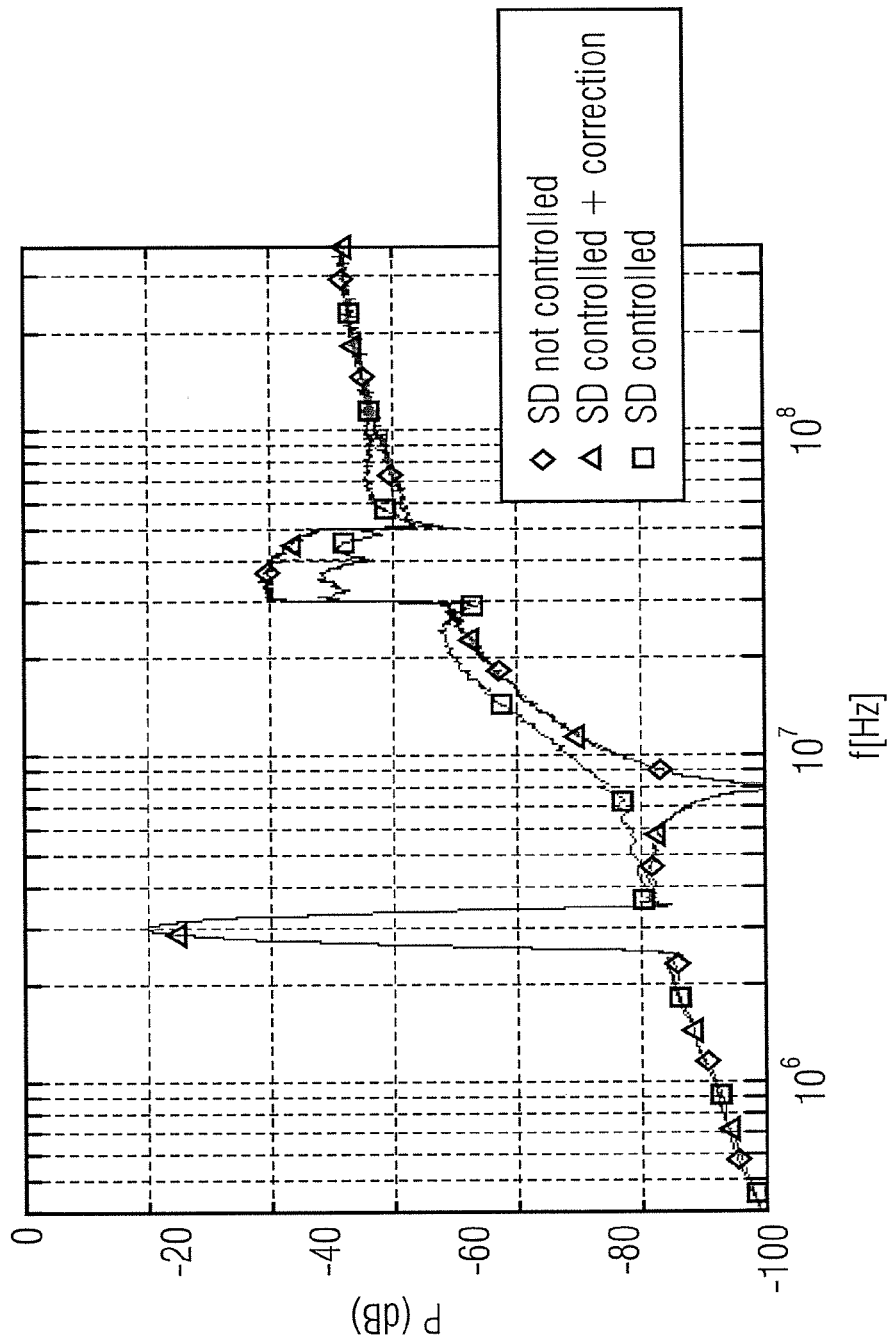
FIG. 19 is similar to FIG. 17 with the exception that the input signal further comprises a cross talk portion caused by a transmit signal.

FIGS. 17, 18, and 19 show frequency plots of a digital output signal of an analog-to-digital converter according to the teachings disclosed herein. The input signal to the analog-to-digital converter comprises a desired reception signal, a noise portion, and, in the case of FIGS. 18 and 19, an interfering blocker signal and crosstalk caused by a transmit signal, respectively.

FIG. 17 illustrates the case in which no interference signal is present, i.e., the input signal of the analog-to-digital converter only comprises the desired reception signal and noise. The desired reception signal has a frequency of 3 MHz. FIG. 17 shows three curves. A first curve is identified by diamond-shapes and corresponds to the frequency behavior of a sigma-delta (SD) modulator without interference cancellation loop ("SD not controlled"). A second curve is identified by squares and corresponds to a sigma-delta modulator with an interference cancellation loop ("SD controlled"). A third curve is identified by triangles and corresponds to a sigma-delta modulator with interference cancellation loop and an additional correction circuitry for correcting deviations from the original signal transfer function of the sigma-delta modulator introduced by the interference cancellation loop ("SD controlled+correction"). The concept of this additional correction will be described below.

It can be seen that the three curves are substantially similar to each other for low frequencies up to approximately 4 MHz, that is including the frequency range of the desired reception signal around 3 MHz. Furthermore, the frequency range in which the desired reception signal is present at 3 MHz is significantly stronger compared to the surrounding frequencies so that the desired reception signal exceeds the noise floor by as much as 80 dB.

In a frequency range from about 4 MHz to about 100 MHz the curve corresponding to the sigma-delta modulator with digital control (i.e., interference cancellation loop, but no correction, indicated by squares in FIG. 17) starts to deviate from the curve of the original, uncontrolled sigma-delta modulator (diamond symbols). The curve corresponding to the controlled and uncorrected sigma-delta modulator (square symbols) also reveals that the output signal of the analog-to-digital converter is attenuated by approximately 10 dB in the frequency range from approximately 30 MHz to approximately 50 MHz which corresponds to the behavior of the overall signal transfer function of a sigma-delta modulator with digital controller illustrated in FIG. 16 (dashed line). In contrast, the curve corresponding to the sigma-delta modulator with digital control and additional correction (triangle symbols in FIG. 17) is substantially identical to the curve corresponding to the original sigma-delta modulator (diamond symbols in FIG. 17). Accordingly, the controlled and corrected sigma-delta modulator also reproduces the band stop behavior of the Noise Transfer Function (NTF) for a frequency of approximately 8 MHz.

FIG. 18 shows a frequency plot that is substantially similar to the frequency plot shown in FIG. 17. The difference between FIG. 17 and FIG. 18 is that a blocker signal at 35 MHz is present within the input signal for the analog-to-digital converter. The blocker signal has a relatively large amplitude compared to the desired reception signal so that the blocker signal also appears in the output signal of the analog-to-digital converter. In particular, the blocker signal has a level of −11.86 dB within the output signal of the original signal-delta modulator. This means that the blocker signal is approximately 8 dB larger than the desired reception signal at the output of the uncontrolled sigma-delta modulator. In the output signal of the controlled sigma-delta modulator (square symbols), the blocker signal has a level of −21.12 dB, only. Thus, the blocker signal is approximately at the level of the desired reception signal. By using digital filtering provided by, for example, a digital signal processor (DSP) the interfering blocker signal at 35 MHz may be further suppressed so that the desired reception signal at 3 MHz may be reliably evaluated under normal circumstances. The curve for the controlled and corrected sigma-delta modulator identified by triangles shows that the blocker signal appears in the output signal with a level of approximately −11.86 dB, as well. However, the appearance of the blocker signal in the output signal is due to the correction, i.e., a reconstruction of the blocker signal by means of a digital replica as shown in FIG. 11. Therefore, the sigma-delta modulator is not required to process the blocker signal. The benefit of the digital control and the correction is that the core sigma-delta modulator does not have to process a large portion of the blocker signal (in terms of an amplitude of the blocker signal).

FIG. 19 shows the frequency spectra of the output signals for an uncontrolled sigma-delta modulator, a controlled sigma-delta modulator, and a controlled and corrected sigma-delta modulator when the input signal comprises an interfering signal caused by transmit cross talk in the frequency range from 30 MHz to 50 MHz. It can be seen that the controlled sigma-delta modulator is capable of suppressing the TX crosstalk by approximately 10 dB in comparison to the uncontrolled sigma-delta modulator. The controlled and corrected sigma-delta modulator (the curve with triangle symbols) reproduces the behavior of the uncontrolled sigma-delta modulator (curve with diamond symbols) so that the transmit signal cross talk is also present in the output signal of the controlled and corrected sigma-delta modulator with a level of approximately −40 dB. Nevertheless, a benefit of the controlled and corrected sigma-delta modulator is that the core sigma-delta modulator does not have to process the entire amplitude or voltage swing of the TX cross talk signal. Thus, the core sigma-delta modulator may have a smaller and simpler configuration, in particular with respect to, for example, capacitances of the loop filter.

The observations which may be made in connection with FIGS. 17 to 19 can be summarized as follows. The spectrum of the output signal of the controlled and corrected sigma-delta modulator is nearly identical to the uncorrected sigma-delta modulator. The spectrum of the controlled sigma-delta modulator (square symbols) displays a reduction of the transmit signal/blocker signal by approximately 10 dB. The in-band noise in the output spectrum of the controlled sigma-delta modulator is higher than in the two other cases, i.e., the uncontrolled sigma-delta modulator and the controlled+corrected sigma-delta modulator. The reason is the round-off noise of the digital circuit, which can be shaped to higher frequencies. The digital correction circuit removes this additional round-off.

Figure 20:
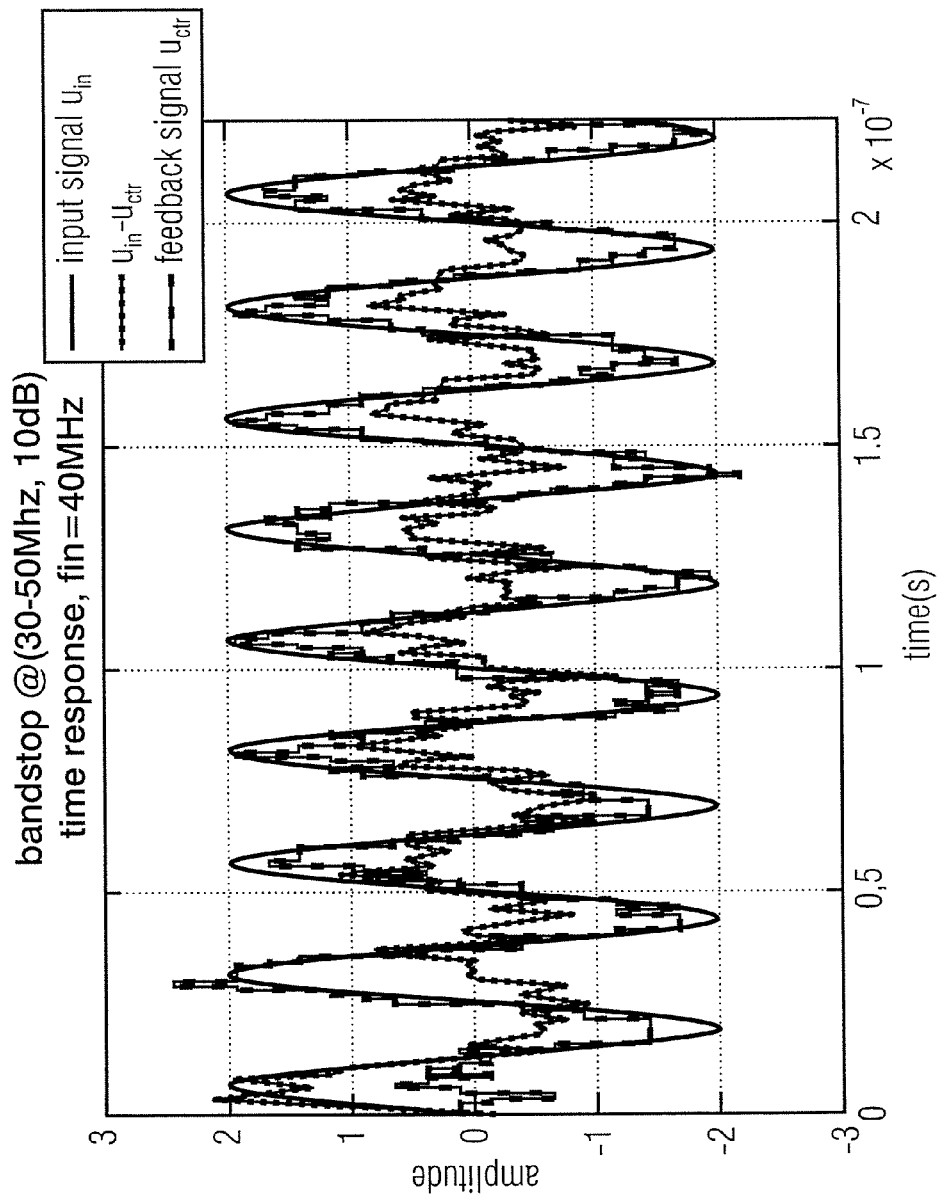
FIG. 20 shows the waveforms of three different signals to illustrate a transient behavior of the digital transmit signal/blocker cancellation loop.

FIG. 20 shows some temporal signals in order to illustrate the waveforms behind the transmit signal/blocker cancellation DAC. The signal "input signal $u_{in}$" is the input signal at a frequency of 40 MHz, which should be suppressed by 10 dB due to the digital control loop according to the teachings disclosed herein. The signal "feedback signal $u_{ctr}$" is the feedback signal of the digital circuit (i.e., of the interference cancellation loop). The signal "$u_{in}$-$u_{ctr}$" is the difference of both. The difference signal $u_{in}$-$u_{ctr}$ has a reduced amplitude with respect to the input signal $u_{in}$. FIG. 20 also illustrates the settling of the control loop because of start-up, in particular during the first half period of the input signal $u_{in}$.

Figure 21:
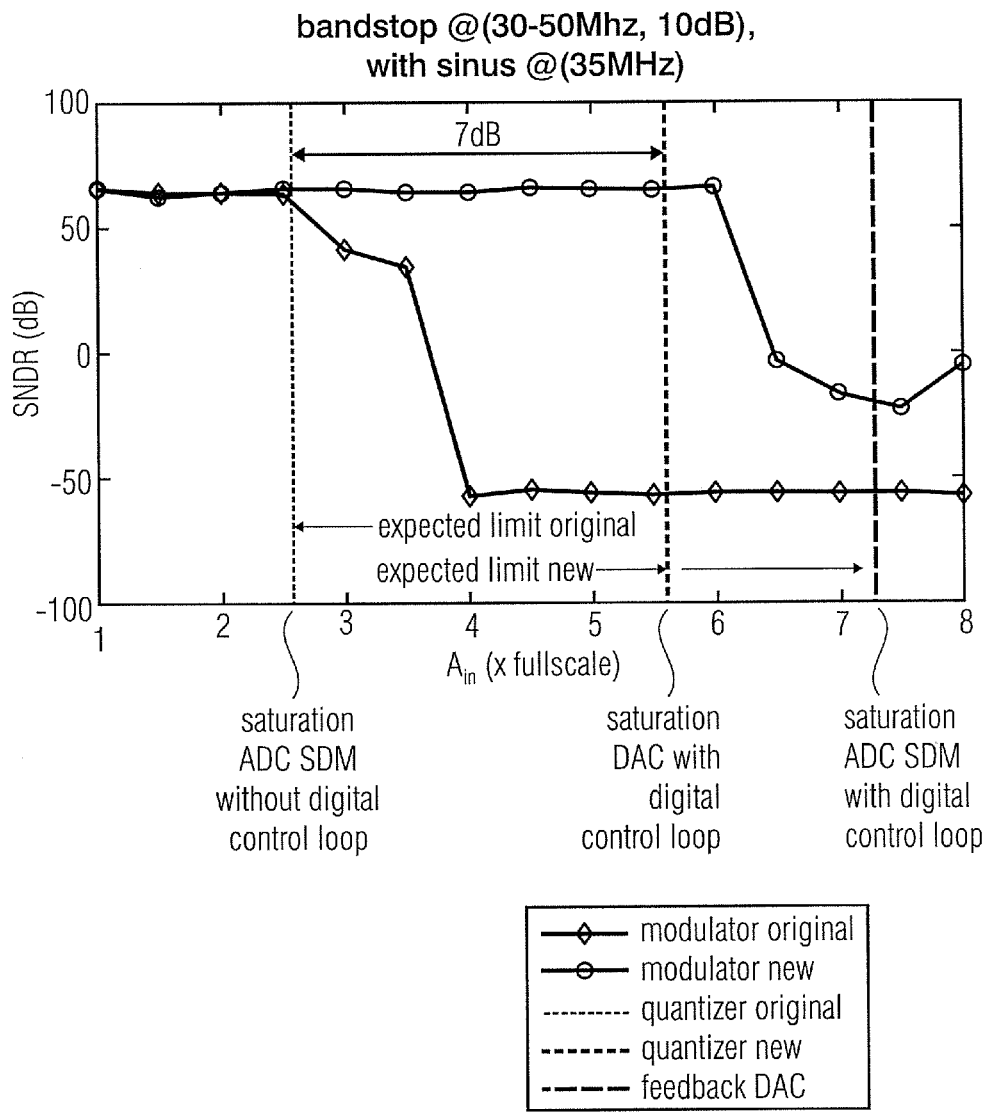
FIG. 21 graphically illustrates the signal-to-noise ratio in dependence on the input amplitude.

FIG. 21 shows a graph illustrating the Signal-to-Noise and Distortion Ratio (SNDR) as a function of changing input amplitude. The curve identified by the diamond symbols corresponds to the SNDR of the original modulator, i.e., a sigma-delta modulator without digital control or interference cancellation loop. It can be seen that up to an interference signal amplitude of 2.6 times the full scale, the original sigma-delta modulator can maintain a signal-to-noise ratio of approximately 60 dB. With increasing amplitude of the interfering signal, the SNDR of the original sigma-delta modulator begins to degrade and becomes smaller than 0 dB for an interfering signal amplitude of approximately 3.8 times the full scale, which may even cause the modulator to become unstable. For even higher amplitudes the Signal-to-Noise and Distortion Ratio settles at approximately −60 dB, i.e., the desired signal is swamped by the blocker signal and typically cannot be extracted, anymore.

The curve identified by the circle symbols illustrates the improvement achieved with an analog-to-digital converter according to the teachings disclosed herein. The SNDR of approximately 60 dB can be maintained for interfering signal amplitudes as high as 6 times the full scale of the quantizer of the sigma-delta modulator. The expected new limit is assumed to be at approximately 5.6 times the full scale. In comparison to the original sigma-delta modulator without digital control or interference cancellation loop, the interfering signal may thus be 7 dB greater for an analog-to-digital converter according to the teachings disclosed herewith.

The feedback digital-to-analog converter, on the other hand, should have a dynamic range corresponding to approximately 7 times the full scale of the quantizer in order to be able to produce sufficiently large cancellation signals to be provided to the signal combiner. However, the feedback DAC might not be required to provide as fine a resolution than the core sigma-delta modulator, because its purpose is to reduce the large amplitudes of an interfering signal contained within the input signal to the analog-to-digital converter.

Figure 22:
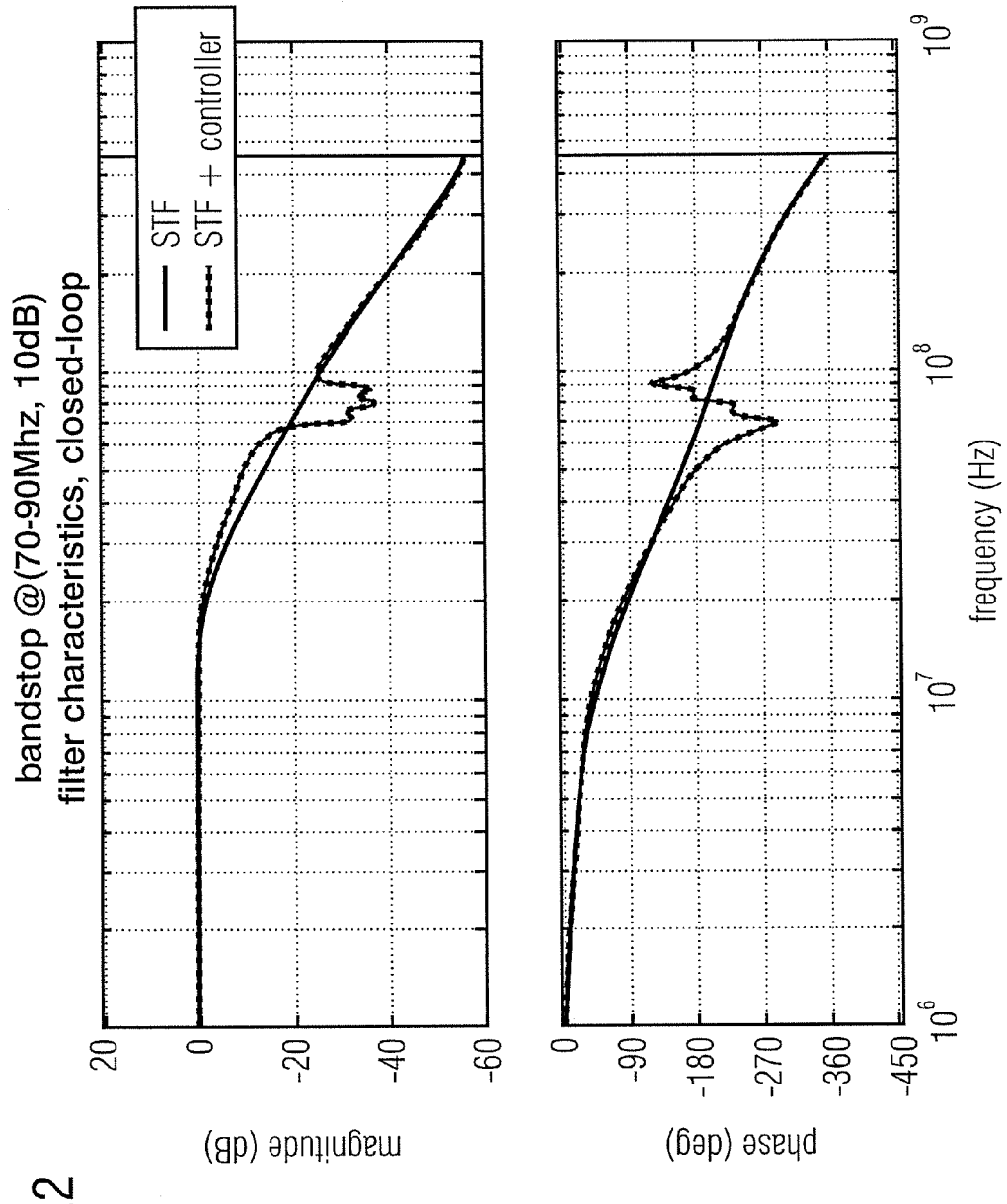
FIG. 22 shows a Bode diagram of the signal transfer function of the sigma-delta modulator without and with controller that causes a band stop between 70 and 90 MHz.

FIG. 22 illustrates a Bode diagram of the closed loop signal transfer functions of the core sigma-delta modulator (STF) and of the core sigma-delta modulator combined with the digital controller (STF+controller) for the case of a band stop in a frequency range from 70 to 90 MHz and a suppression of 10 dB within this frequency range.

Figure 23:
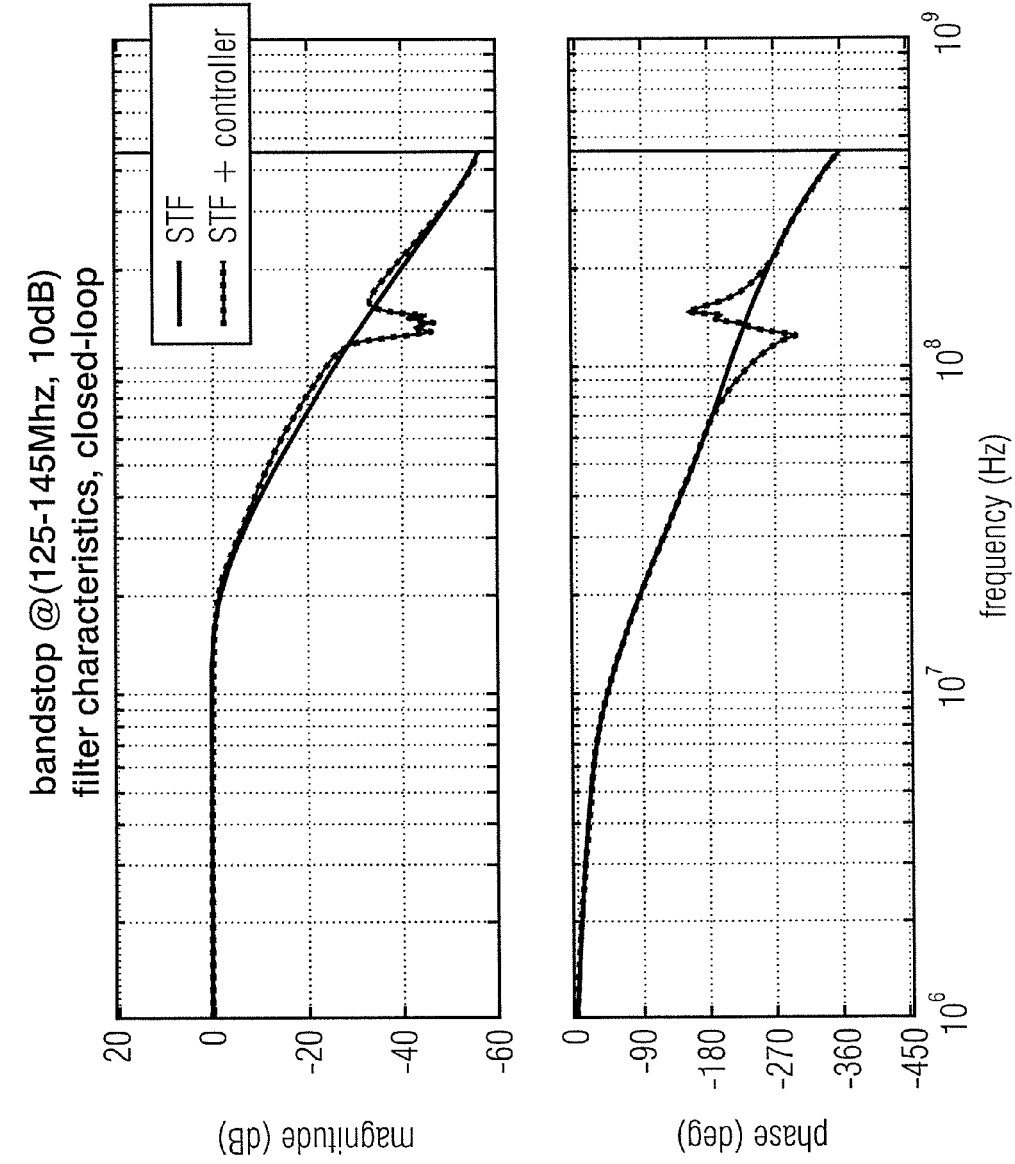
FIG. 23 shows a Bode diagram of the signal transfer function of the sigma-delta modulator without and with controller that causes a band stop between 125 and 145 MHz.

FIG. 23 shows a Bode diagram similar to the Bode diagram illustrated in FIG. 22 for a band stop in a frequency range from 125 to 145 MHz instead of 70 to 90 MHz.

Figure 24:
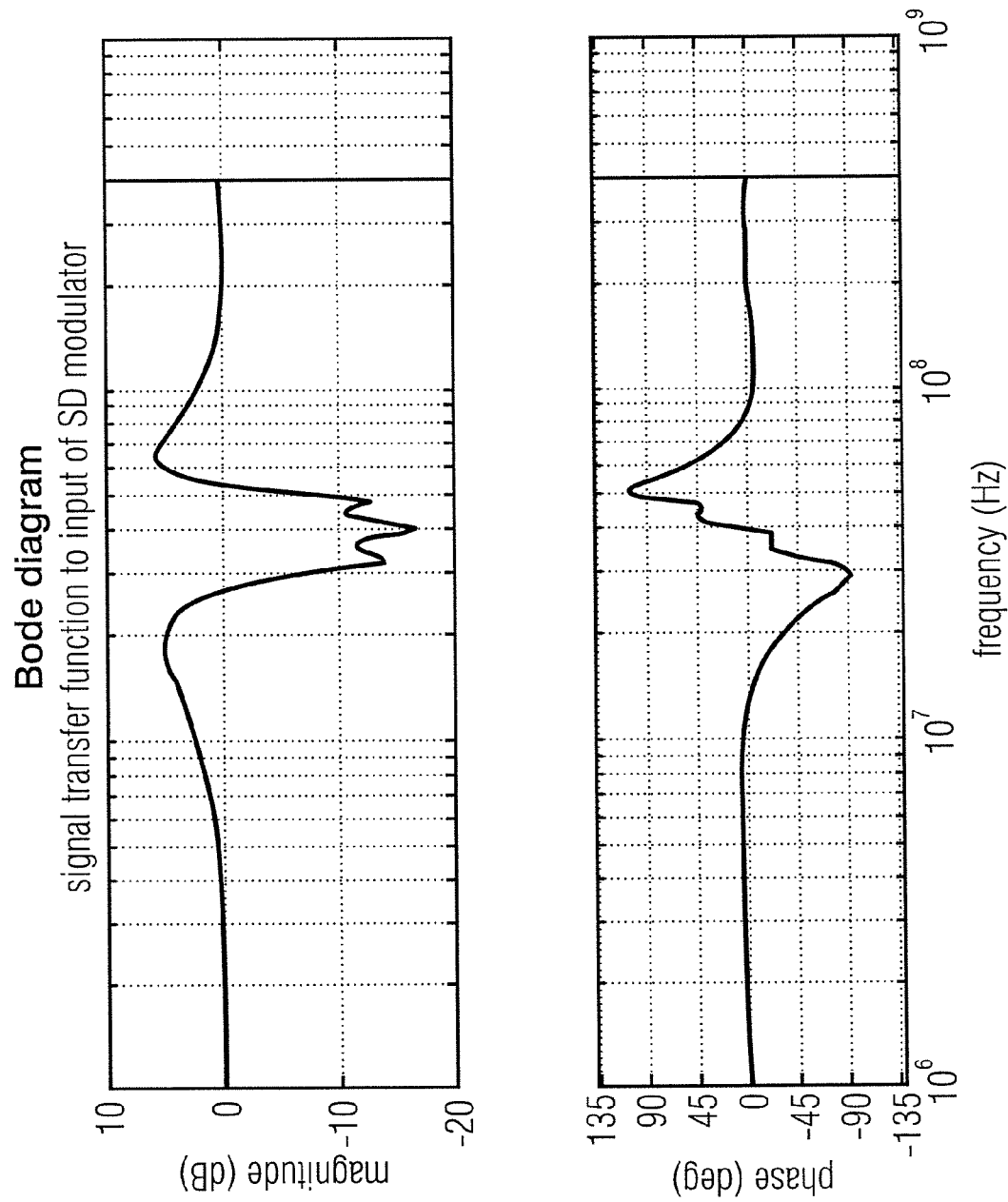
FIG. 24 shows a Bode diagram of the signal transfer function up to the input of the sigma-delta modulator.

FIG. 24 illustrates a Bode diagram of the signal transfer function to the input of the sigma-delta modulator. It can be seen that in the frequency range from 30 MHz to 50 MHz a band stop with a suppression of at least 10 dB could be achieved. However, in the direct vicinity of this frequency range [30 MHz . . . 50 MHz], the Bode diagram reveals a boosting behavior of approximately 5 dB of the signal transfer function. In particular, a local maximum can be observed at approximately 18 MHz and another local maximum can be observed at approximately 65 MHz. However, under normal circumstances it is highly unlikely that two blocker signals would be that close to each other in the frequency domain. Therefore, it can typically be assumed that in the frequency range adjacent to an expected frequency range of a possible blocker signal or crosstalk signal no further strong blockers or cross talk signals are present, at least as long as the analog-to-digital converter or signal processor according to the teachings disclosed herein is operated in a standard-compliant environment.

Figure 25:
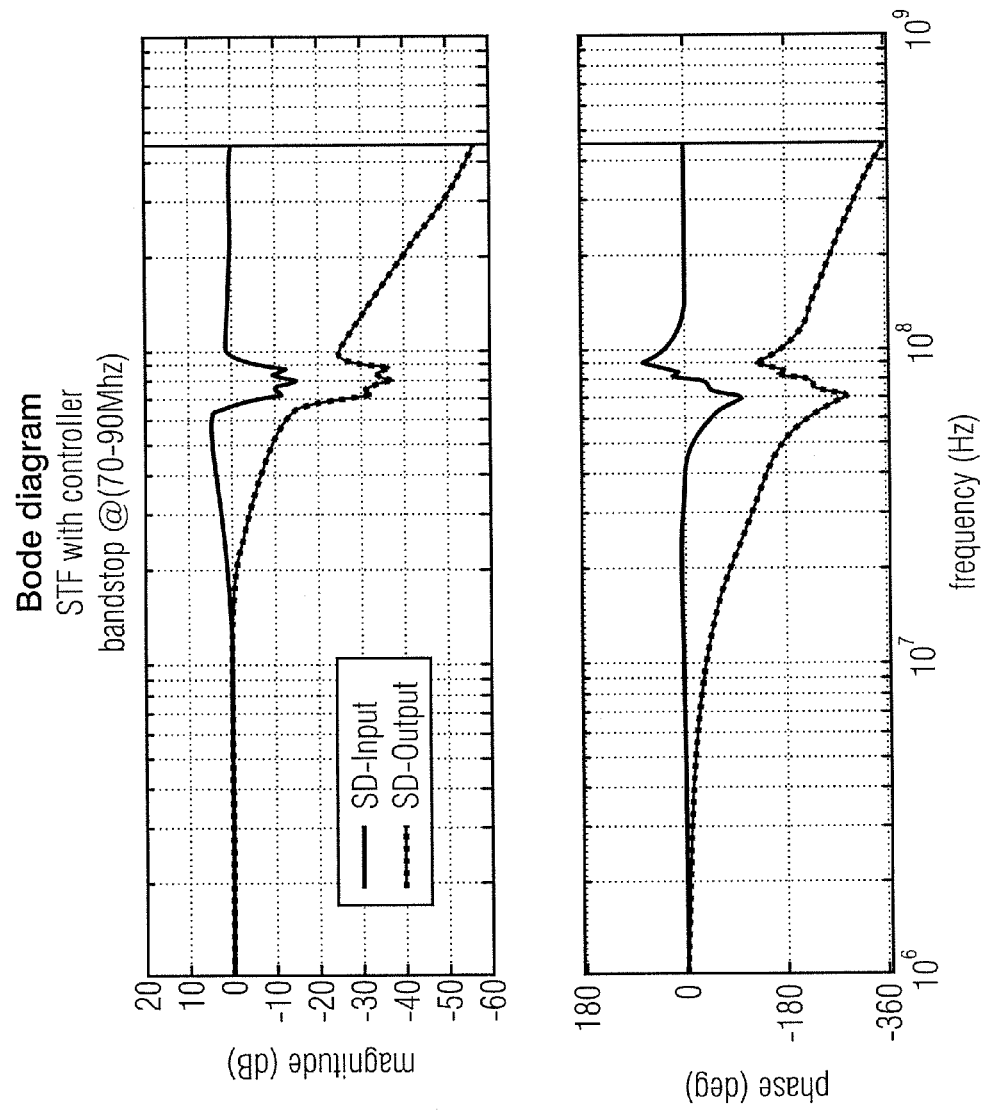
FIG. 25 shows a Bode diagram of the signal transfer functions with controller up to the input and the output of the sigma-delta modulator.

FIG. 25 illustrates another Bode diagram of a signal transfer function to the input of the sigma-delta modulator and another signal transfer function to the output of the sigma-delta modulator for a band stop in a frequency range from 70 MHz to 90 MHz. As with the Bode diagram in FIG. 24 it can be seen that the signal transfer function up to the input of the sigma-delta modulator has local maxima at approximately 60 MHz and 100 MHz. However, in the signal transfer function to the output of the sigma-delta modulator these local maxima are hardly noticeable. As explained, it can typically be assumed that no significant suppression is necessary immediately adjacent to the expected frequency range of the blocker signal or the transmit cross talk signal.

Figure 26:
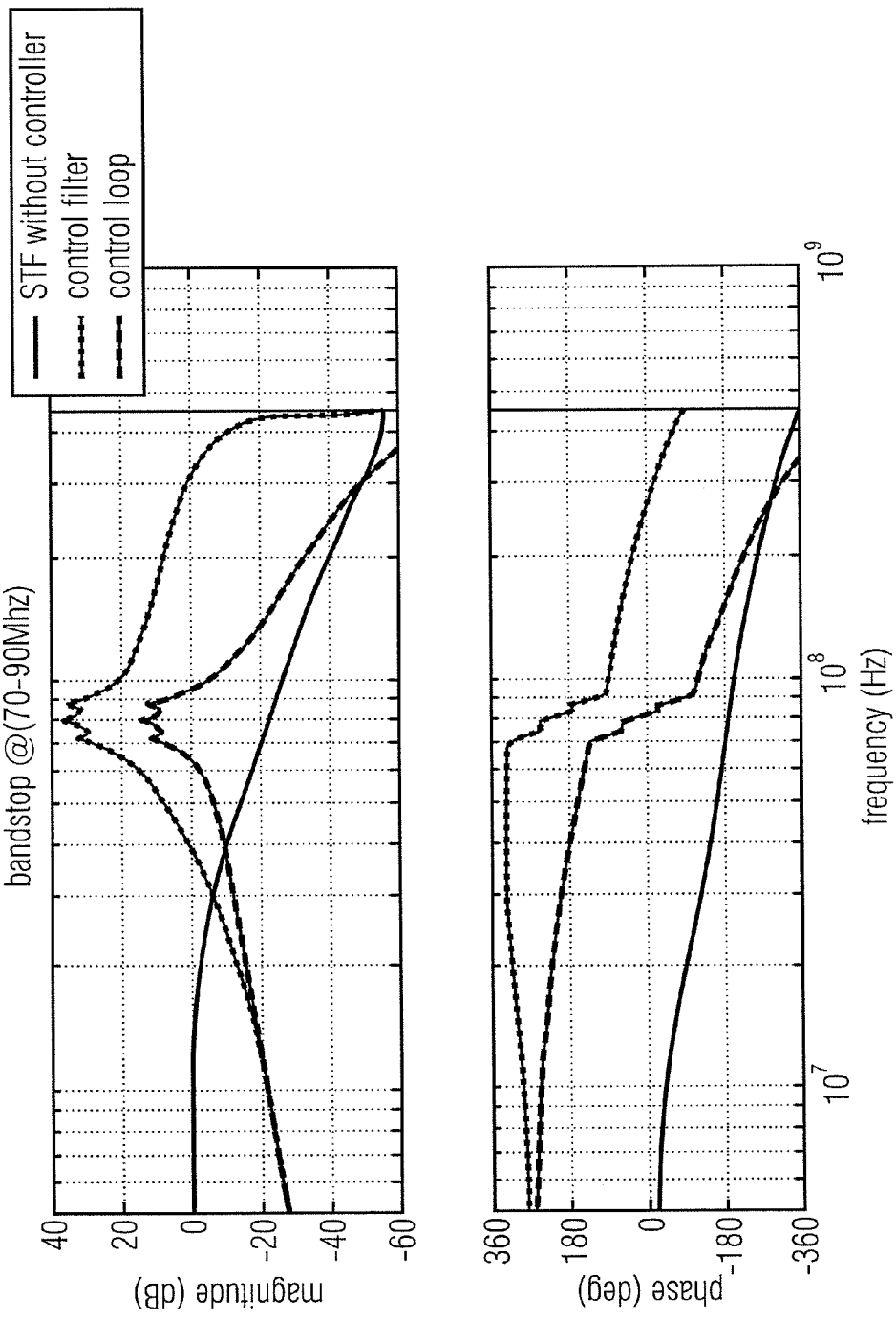
FIG. 26 shows a Bode diagram of the signal transfer function without controller, of the control filter, and of the controlled system.

FIG. 26 shows a further Bode diagram for the 70 to 90 MHz band stop case. The Bode diagram contains three signal transfer functions, namely the signal transfer function of the sigma-delta modulator without controller (for reference purposes), the signal transfer function of the control filter, and the signal transfer function of the control loop. By comparing the signal transfer function of the control filter with the signal transfer function of the control loop it can be observed that the control loop has less amplification in the frequency range of 70 MHz to 90 MHz than the control filter alone. Furthermore, the control loop introduces an additional attenuation for higher frequencies, i.e., greater than 90 MHz. This additional attenuation may be provided, inter alia, by the analog reconstruction lowpass filters in order to suppress quantization noise created by the digital-to-analog converters within the digital controllers.

Figure 27:
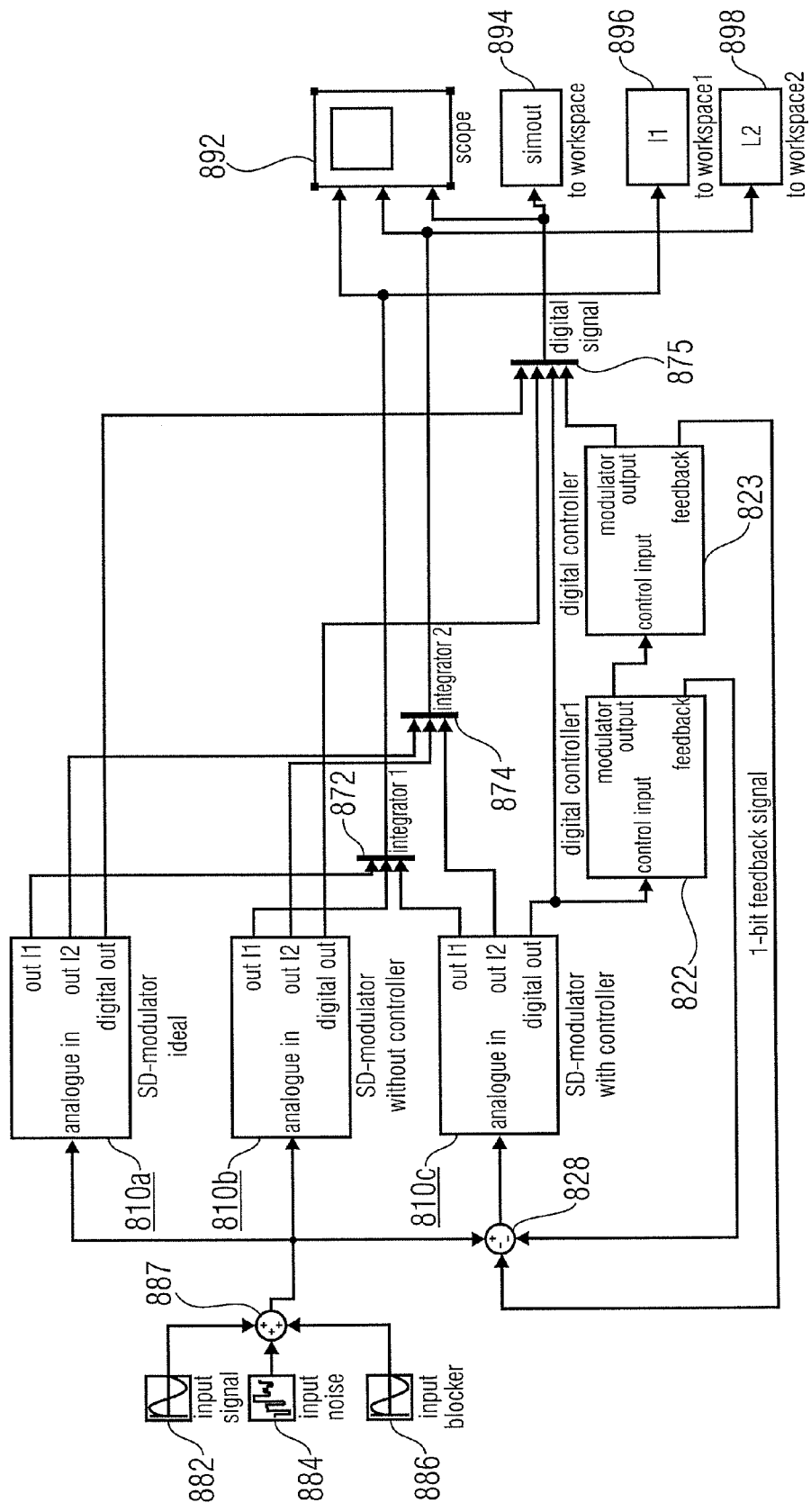
FIG. 27 shows a schematic block diagram of a test setup with three sigma-delta modulators in different configurations (ideal, non-ideal without controller, and non-ideal with controller)

FIG. 27 shows a schematic block diagram of a test setup implemented in a simulation software for digital signal processing. A first signal generator 882 produces the input signal representing the desired reception signal of a receiver comprising an analog-to-digital converter according to the teachings disclosed herein. A second signal generator 884 produces a noise signal in order to model typical background noise picked up by an antenna of the receiver. A third signal generator 886 produces a blocker signal which is assumed to be a sine signal at a given blocker frequency. The signals produced by the three signal generators 882, 884, 886 are summed by means of an adder 887.

Figure 33:
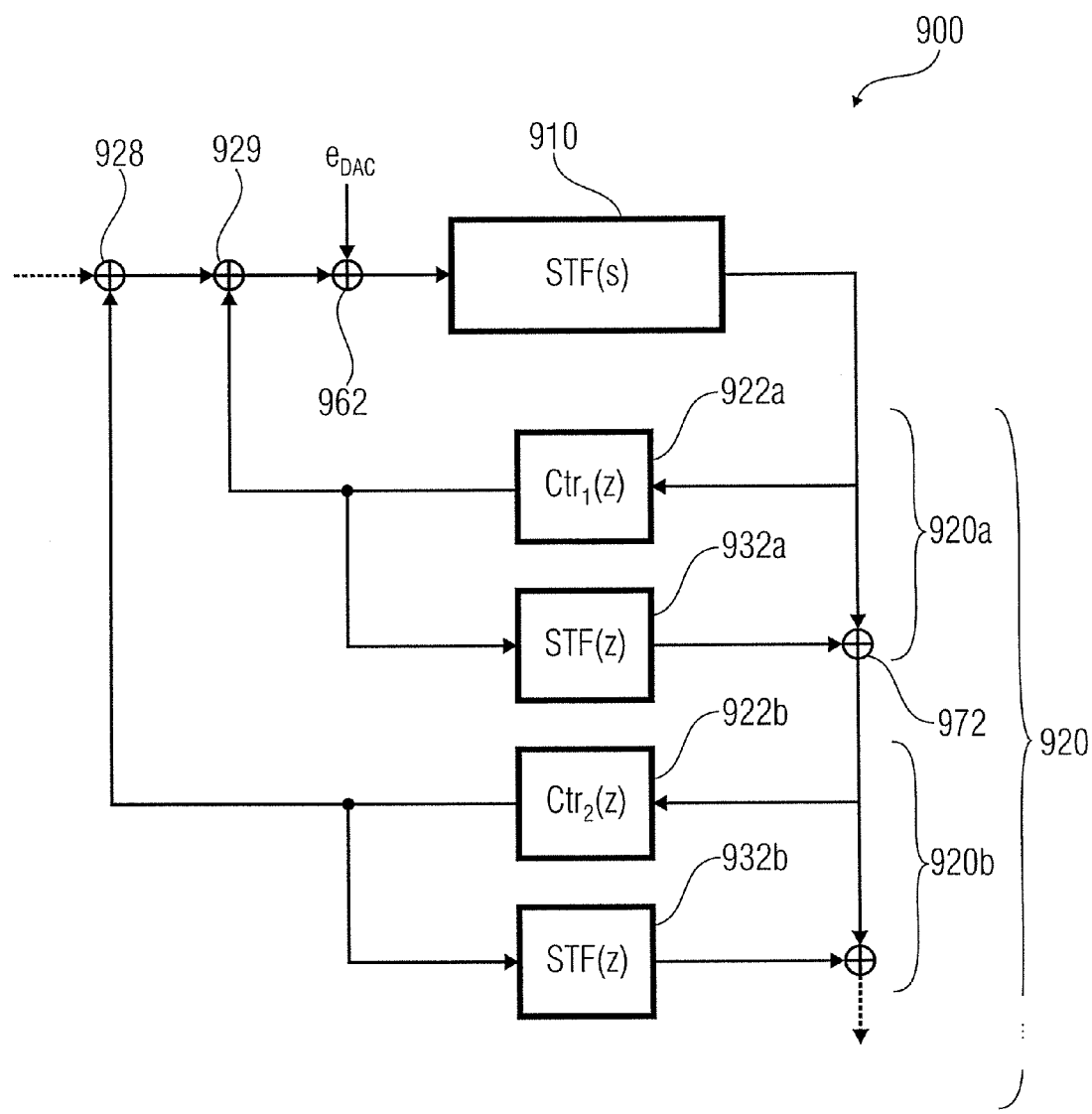
FIG. 33 shows a schematic block diagram illustrating a concept of cascading controllers with signal transfer function regeneration.

For the sake of comparison, the test setup comprises three modulators operating in parallel on the same input signal provided at an output of the adder 887. The three sigma-delta modulators are: an ideal sigma-delta modulator 810*a*, a non-ideal sigma-delta modulator 810*b* which is not connected to a controller, and a non-ideal sigma-delta modulator 810*c* which is connected to a cascaded arrangement of two digital controllers 822, 823 and a signal combiner 828. A cascaded arrangement of two digital controllers is also illustrated in FIG. 33 and the principles of such a cascaded arrangement are explained below in the context of the description of FIG. 33.

The test setup further comprises three multiplexers 872, 874, and 875 for signal acquisition and diagnosis purposes. A first multiplexer 872 is connected to outputs labeled "out 11" of the three sigma-delta modulators 810*a*, 810*b*, 810*c*. A second multiplexer 874 is connected to outputs labeled "out l2" of the sigma-delta modulators 810*a*, 810*b*, 810*c*. A third multiplexer 874 is connected to outputs labeled "digital out" of the three sigma-delta modulators 810*a*, 810*b*, 810*c*, as well as to an output labeled "modulator output" of the second digital controller 823. Outputs of the three multiplexers 872, 874, 875 are connected to a scope block 892 for visualization purposes and to corresponding workspaces "simout" 894, "l1" (reference sign 896), and "l2" (reference sign 898).

An analog-to-digital converter according to the teachings disclosed herein is in particular modeled by the sigma-delta modulator 810*c* and an interference cancellation loop comprising the digital controllers 822, 823 and the signal combiner 828. The other two sigma-delta modulators 810*a* and 810*b* are provided for reference and comparison.

Figure 28:
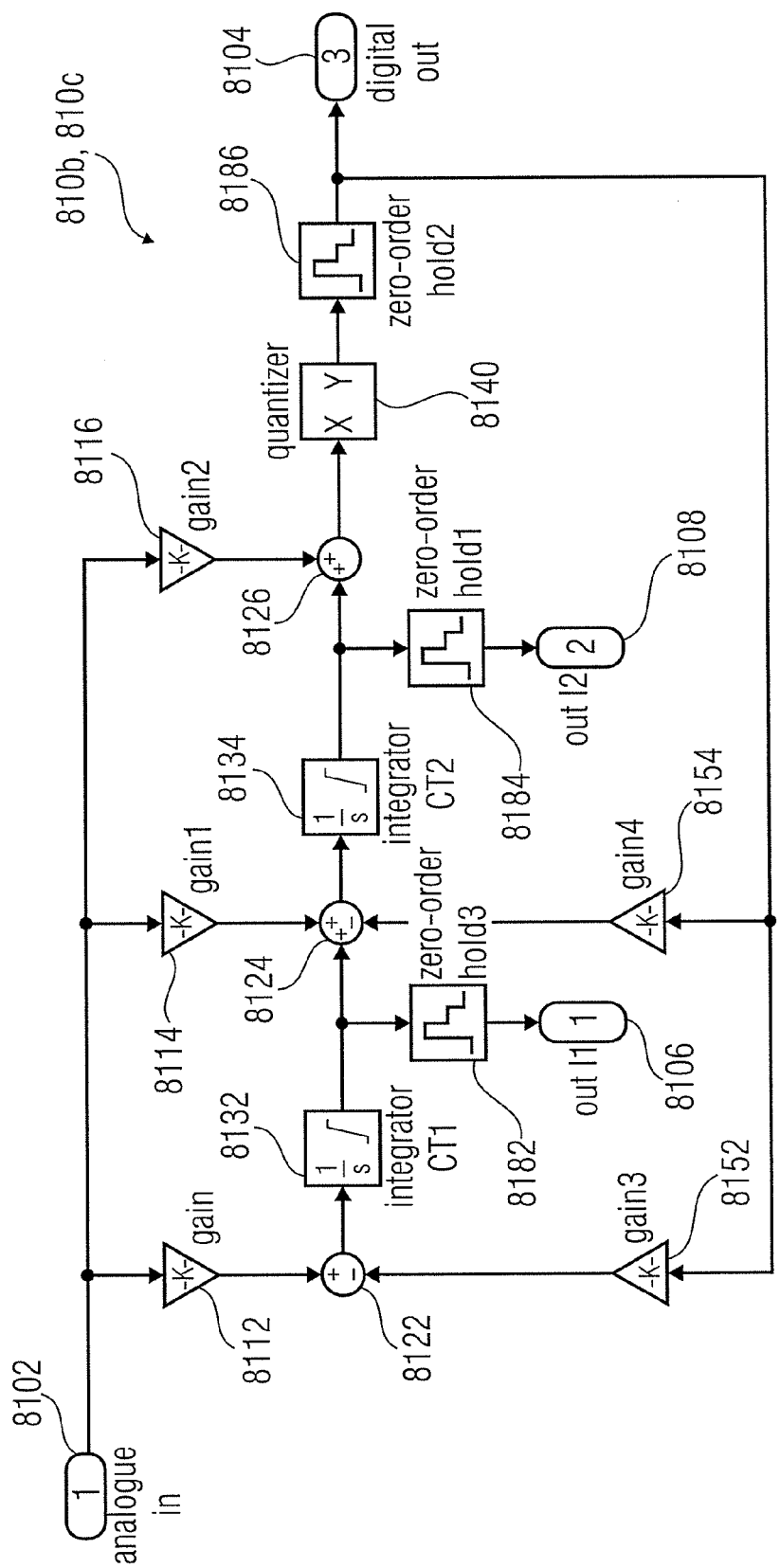
FIG. 28 shows a schematic block diagram of the sigma-delta modulator used in the test setup of FIG. 27.

FIG. 28 shows a schematic block diagram of the non-ideal sigma-delta modulators 810*b*, 810*c* used in the test setup shown in FIG. 27. The sigma-delta modulator 810*b*, 810*c* comprises an analog input 8102 and a digital output 8104. For visualization purposes the sigma-delta modulator 810*b*, 810*c* further comprises two analog outputs 8106 and 8108, corresponding to the outputs "out l1" and "out l2", respectively. A loop filter of the sigma-delta modulator 810*b*, 810*c* comprises a plurality of scalar multiplication unit 8112, 8114, 8116, 8152, and 8154. The scalar multiplication elements 8112, 8114, 8116 receive the analog modulator input signal from the analog input 8102 and provide a corresponding output signal to one of a plurality of signal combiners 8122, 8124, and 8126. The scalar multiplication elements 8152 and 8154 receive the digital output signal from the digital output 8104 of the sigma-delta modulator 810*b*, 810*c* and provide a corresponding scalar multiplied signal to the signal combiners 8122 and 8124, respectively. The output signals generated by the signal combiners 8122 and 8124 are integrated by means of an integrator 8132 and an integrator 8134, respectively. An output of the integrator 8134 is connected to the signal combiner 8124 and to an input of a zero-order sample-and-hold element 8182, an output of which is connected to the output terminal 8106 of the sigma-delta modulator 810*b*, 810*c*. An output of the integrator 8134 is connected to an input of the signal combiner 8126 and an input of another zero-order sample-and-hold element 8184, an output of which is connected to the output terminal 8108 of the sigma-delta modulator 810*b*, 810*c*. Due to the two integrators 8132, 8134, the sigma-delta modulator 810*b*, 810*c* is of second order.

An output of the signal combiner 8126 is connected to an input of a quantizer 8140. An output of the quantizer 8140 is connected to the digital output 8104 of the sigma-delta modulator 810*b*, 810*c* via another zero-order sample-and-hold element 8186.

The scalar factors for the scalar multiplication elements 8112, 8114, 8116 may be, for example, given by a vector b=[0.2164 0 0]. The scalar factors for the scalar multiplication elements 8152 and 8154 may be, for example, by a vector a=[0.2164 0.6667].

Figure 29:
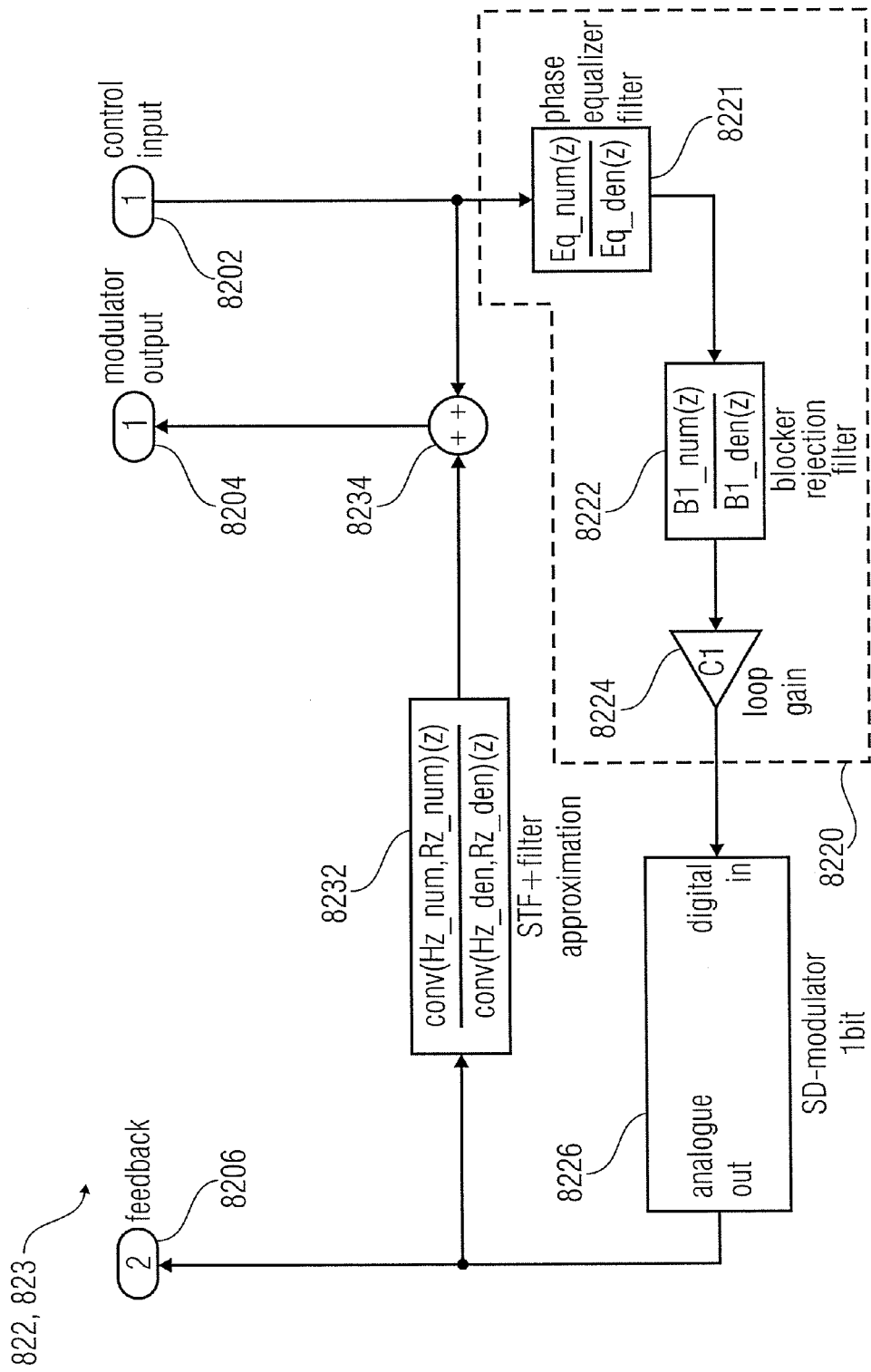
FIG. 29 shows a schematic block diagram of the digital controller used in the test setup of FIG. 27.

FIG. 29 shows a schematic block diagram of the digital controller 822 or the digital controller 823 used in the test setup of FIG. 27. The digital controller 822, 823 comprises a control input 8202, a modulator output 8204, and a feedback output 8206. Furthermore, the digital controller comprises a phase equalizer filter 8221, a blocker rejection filter 8222, a loop gain element 8224, and a 1-bit sigma-delta modulator 8226 in a signal processing chain between the control input 8202 and the feedback output 8206. The phase equalizer filter 8221, the blocker rejection filter 8222, and the loop gain element 8224 form the digital control filter 8220 (box drawn in dashed line in FIG. 29). The digital controller 822, 823 further comprises a STF+filter approximation 8232 and a signal combiner 8234. The STF+filter approximation 8232 receives the analog feedback signal that is produced by the 1-bit sigma-delta modulator 8226 and an output signal of the STF+filter approximation 8232 is provided as one of two inputs of the signal combiner 8234. The other input for the signal combiner 8234 is provided by the control input 8202. An output of the signal combiner 8234 is connected to the modulator output 8204 of the digital controller 822, 823.

The STF+filter approximation 8232 may be understood as a digital replica of the signal transfer function of the core sigma-delta modulator 810*c* shown in FIG. 27. This digital replica is configured to receive the filtered digital feedback signal and to provide an estimated response of the sigma-delta modulator 810*c* in response to the digital feedback signal. The estimated response is then added, by means of the signal combiner 8234, to the digital modulator output signal or a derived modulator output signal to provide an output signal of the analog-to-digital converter.

Figure 30:
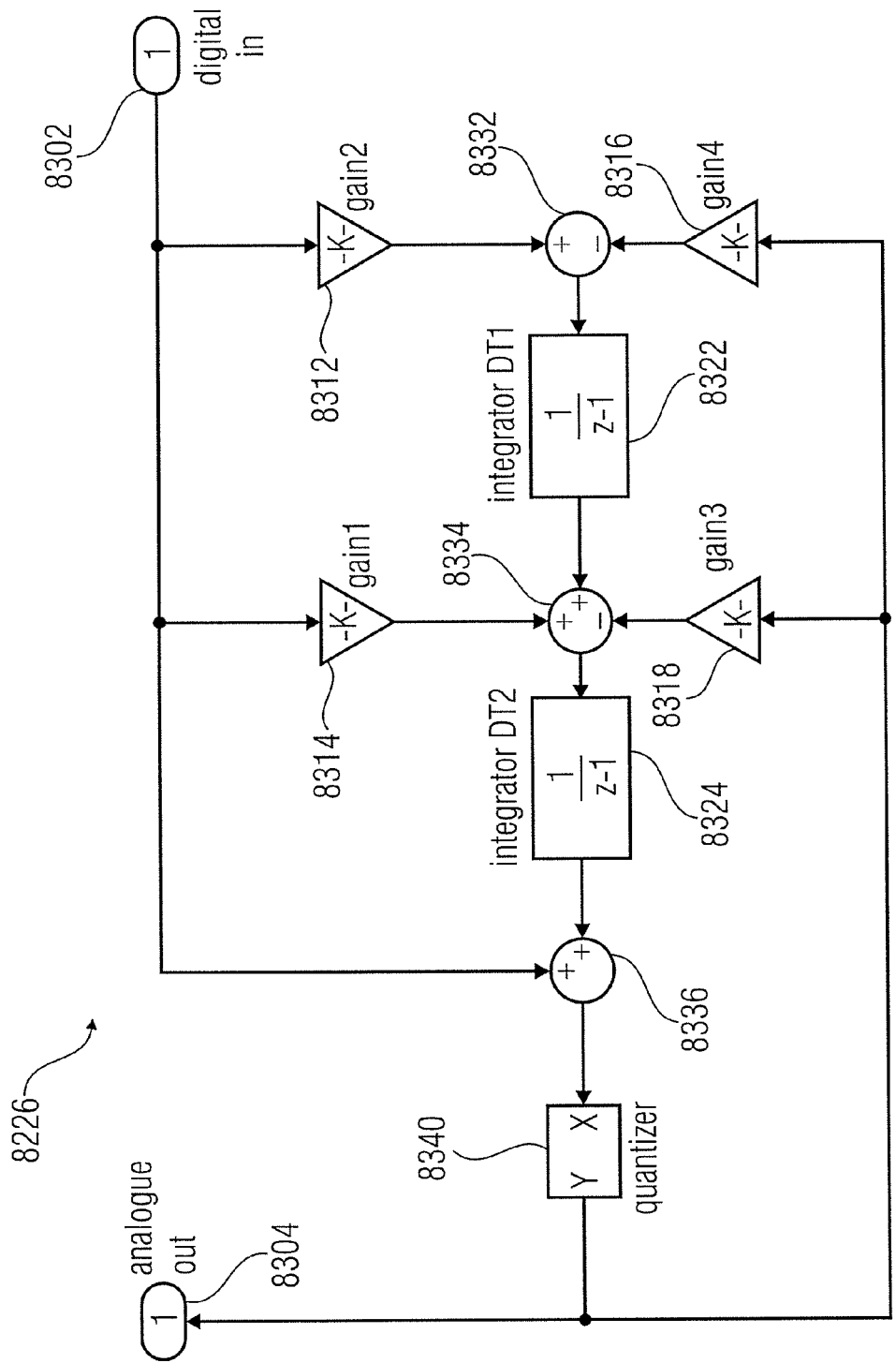
FIG. 30 shows a schematic block diagram of the digital-to-analog converter (digital sigma-delta modulator) of the test setup of FIG. 27.

FIG. 30 shows a schematic block diagram of the digital sigma-delta modulator 8226 in FIG. 29. The 1-bit sigma-delta modulator 8226 comprises a digital input 8302 and an analog output 82304. The digital input 8302 is connected to two scalar multiplication elements 8312 and 8314, and also to a signal combiner 8336. The analog output 8304 is connected to an output of a quantizer 8340. The output of the quantizer 8340 is also connected to two further scalar multiplication elements 8316, 8318. The outputs of the two scalar multiplication elements 8312 and 8316 are combined by means of the signal combiner 8332. An output of the signal combiner 8332 is provided to an integrator 8322. The output of the integrator 8322 is combined with the outputs of the two scalar multiplication elements 8314 and 8318 to provide an input signal for a second integrator 8324. An output of the second integrator 8324 is combined with the digital input signal by means of the already mentioned signal combiner 8336, in order to generate the input signal for the quantizer 8340.

Figure 31:
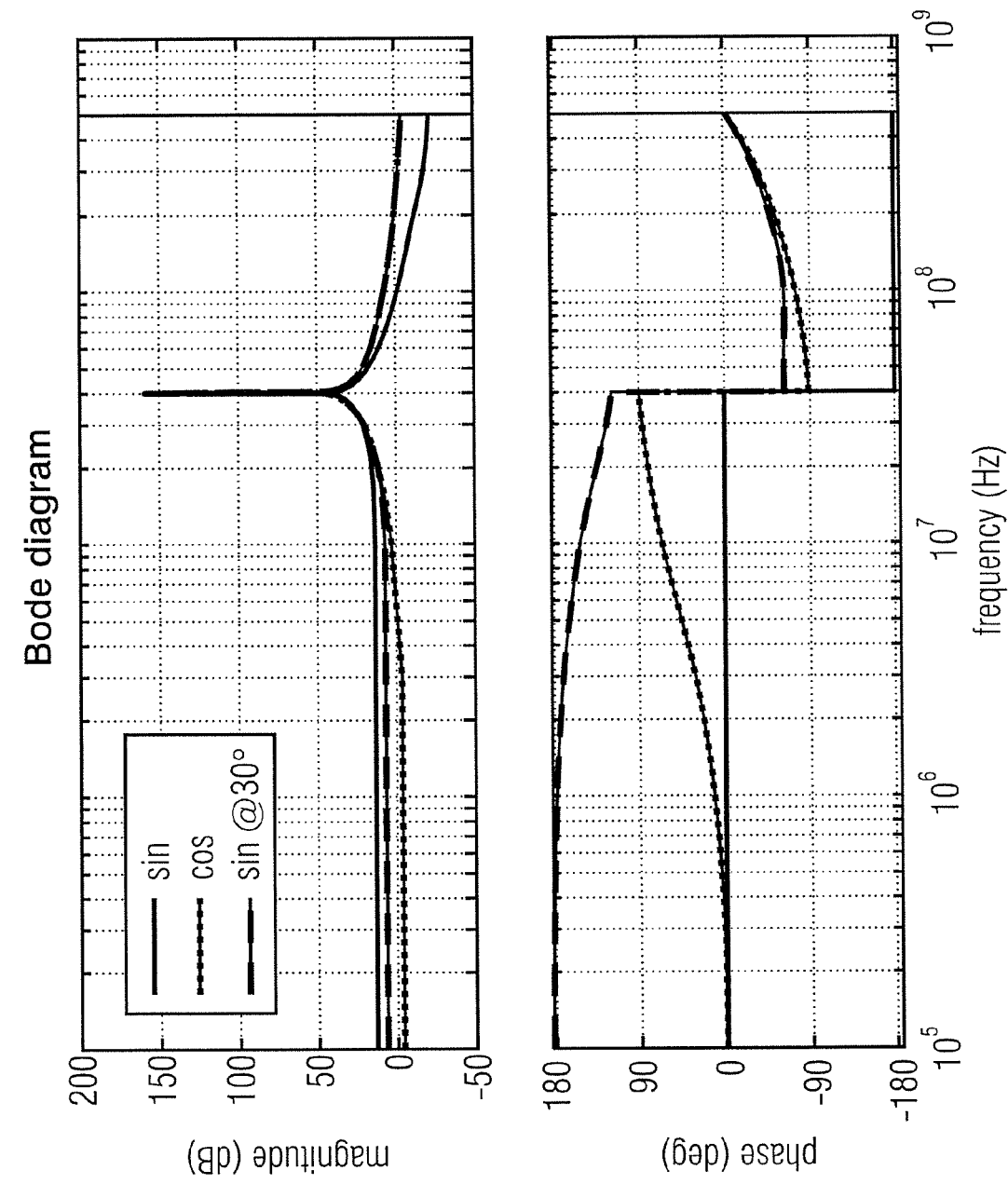
FIG. 31 shows a Bode diagram of sine-based and cosine-based control filters.

FIG. 31 illustrates a Bode diagram of the signal transfer function of the blocker rejection filter 8222 (FIG. 29). The curve labeled "sin" corresponds to the following formula:

$$S(z, a, b, T): e^{-akT}\sin(bkT) \Rightarrow$$

$$\frac{e^{-aT}\sin(bT)z}{z^2 - 2e^{-aT}\cos(bT)z + e^{-2aT}} \xrightarrow{a=0} \frac{\sin(bT)z}{z^2 - 2\cos(bT)z + 1}$$

The curve labeled "cos" corresponds to the formula $$C(z, a, b, T): e^{-akT}\cos(bkT) \Rightarrow$$

$$\frac{z(z - e^{-aT}\cos(bT))}{z^2 - 2e^{-aT}\cos(bT)z + e^{-2aT}} \xrightarrow{a=0} \frac{z(z - \cos(bT))}{z^2 - 2\cos(bT)z + 1}$$

In order to obtain a desired phase shift, the sine-based filter and the cosine-based filter may be combined as follows:

$$P(z,a,b,T,\beta):e^{-akT}\cos(bkT+\beta) \Rightarrow \cos(\beta)C(z,a,b,T) - \sin(\beta)S(z,a,b,T)$$

FIG. 31 illustrates such a combination for 30° (curve labeled "sin @30°"). The sine-based filter and the cosine-based filter represent different resonators and may be implemented as different digital filters. In such a configuration, the resonators typically need different phase responses, depending on the STF to stabilize the loop.

Figure 32:
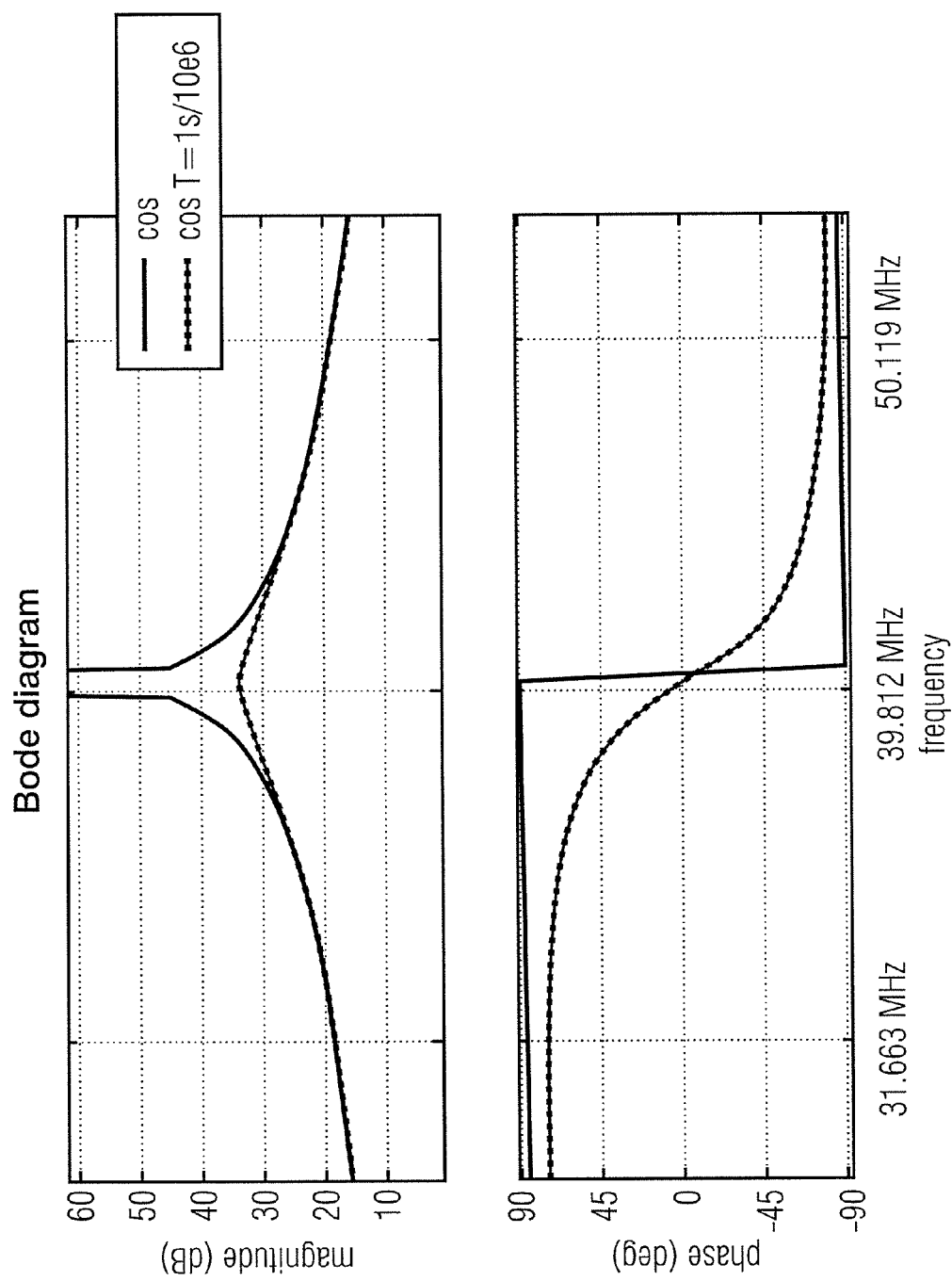
FIG. 32 shows a Bode diagram of undamped and damped cosine-based control filters.

FIG. 32 shows a further Bode diagram in which the signal transfer function of the cosine-based control filter or blocker rejection filter and the signal transfer function of a damped cosine-based filter are illustrated. It can be seen in FIG. 32 that a resonator with less quality (lower quality factor) has a smoother phase response, which typically leads to a more stable loop.

FIG. 33 shows a schematic block diagram of an analog-to-digital converter according to some embodiments of the teachings disclosed herein. The analog-to-digital converter 900 comprises a core sigma-delta modulator 910 and an interference cancellation loop 920. The interference cancellation loop 920 comprises, among others, two signal combiners 928, 929 by means of which cancellation signals generated by the interference cancellation loop 920 are injected into the input signal that is fed to the analog-to-digital converter or signal processor 900. The interference cancellation loop comprises a cascaded arrangement of at least two feedback branches 920*a* and 920*b*. Each feedback branch comprises a digital filter 922*a*, 922*b* and a digital-to-analog converter (not illustrated in FIG. 33). Furthermore, each feedback branch 920*a*, 920*b* comprises a digital replica 932*a*, 932*b* of the sigma-delta modulator 910.

The digital filter 922*b* may be regarded as a main digital filter and the digital replica 932*b* may be regarded as a main digital replica. On the other hand, the digital filter 922*a* and the digital replica 932*a* may be regarded as a further digital filter and a further digital replica, respectively. A further estimator response provided by the further digital replica 932*a* is added to the digital modulator output signal provided by the sigma-delta modulator 910, by means of a signal combiner 972. A derived filter signal for the digital filter 922*b* is provided at an output of the signal combiner 972. A further digital filtered signal provided by the further digital filter 922*a* is added to the digital filtered signal provided by the (main) digital filter 922*b* to provide the cancellation signal. According to the embodiment shown in FIG. 33, the cancellation signal is injected in two portions into the analog input signal, namely a first portion provided by the digital filter 922*b* at the signal combiner 928, and a second portion provided by the further digital filter 922*a* at the further signal combiner 929. However, a different arrangement of the signal combiners 928 and 929 is also possible.

According to the teachings disclosed herein, the injection of a signal and the input of a sigma-delta modulator is possible and may be used for interference cancellation. Furthermore, a digital reconstruction of the sigma-delta modulator may be used in order to correct errors introduced by the injection of the cancellation signal. Controllers may be designed for blocker suppression by means of several oscillators and/or cascaded control. A cascaded controller thus designed may then be combined to a control filter.

However, the controller requires a compensation of the poles of the sigma-delta modulator. This typically leads to a good signal suppression, however the quantization noise of the modulator is amplified.

Moreover, an amplitude elevation can typically be observed next to the band stop in a signal transfer function from an input of the analog-to-digital converter or signal processor up to an input of the core sigma-delta modulator.

The controller typically requires a relatively high order.

Another possible approach may be to use a MASH (multi-stage noise shaping) structure in order to remove the quantization noise from the digital controller/digital filter. It may also be possible to perform an echo compensation by means of a Kalman filter instead of a control loop.

Further options for the analog-to-digital converter or the signal processor according to the teachings disclosed herewith are:

Offset cancellation with integral controller
Eliminating noise problem with a MASH structure
Detecting narrow-band blocker and adaptive resonator
Alternative control architectures
Using feed-in paths for control loop
Using complex controller
Using cascading without correction In summary, the teachings disclosed herein relate to interference cancellation in frequency translating and/or sub-sampling sigma-delta modulators. Regarding blocker suppression, the teachings disclosed herein relate to a controller concept for suppressing blockers. The suppression of several wideband blockers (possibly up to an arbitrary number) appears to be, in principle, possible. The proposed concept is, in principle, also applicable to high frequency blockers (greater than 50 MHz), although some special precautions may be required.

The teachings disclosed herein may be in particular be used in an apparatus comprising a baseband processor, an antenna, and an analog-to-digital converter as disclosed herein. Such an apparatus may be part of a mobile communication device or another device for wireless communication. In particular, the teachings disclosed may be used in mobile devices, such as mobile phones, cell phones, Smartphones, tablet computers, etc. Furthermore, the teachings disclosed herein may also be used in network equipment or infrastructure of mobile communications networks or wireless networks, such as base transceiver stations, WLAN routers and/or repeaters, etc.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. An analog-to-digital converter for converting an input signal, the analog-to-digital converter comprising:
   a sigma-delta modulator configured to receive an analog modulator input signal and provide a digital modulator output signal; and
   an interference cancellation loop, comprising:
   a digital filter configured to amplify the digital modulator output signal in a frequency band, attenuate the digital modulator output signal outside the frequency band and a transition band surrounding the frequency band, and provide a filtered digital feedback signal;
   a digital-to-analog converter configured to convert the filtered digital feedback signal to a cancellation signal; and
   a signal combiner configured to combine the analog modulator input signal with the cancellation signal resulting in the analog modulator input signal, in order to at least partially cancel interference signal portions within the analog modulator input signal,
   wherein the interference cancellation loop comprises a digital replica of a signal transfer function of the sigma-delta modulator, wherein the digital replica is configured to receive the filtered digital feedback signal or a derived filtered signal, and provide an estimated response of the sigma-delta modulator in response to the digital filtered feedback signal or the derived filtered signal, wherein the estimated response is combined with the digital modulator output signal or a derived modulator output signal to provide an output signal of the analog-to-digital converter.

2. The analog-to-digital converter according to claim 1, wherein the digital filter is configured to attenuate the digital modulator output signal in an in-band frequency range of the analog modulator input signal and amplify the digital modulator output signal in an out-of-band frequency range of the analog modulator input signal.

3. The analog to digital converter according to claim 1, wherein the digital filter comprises a digital resonator.

4. The analog-to-digital converter according to claim 1, wherein the interference cancellation loop further comprises a digital noise shaper between an output of the sigma-delta modulator and the digital-to-analog converter.

5. The analog-to-digital converter according to claim 1, wherein the interference cancellation loop comprises a further digital replica of the signal transfer function of the sigma-delta modulator and a further digital filter, wherein the further digital replica and the further filter are arranged in a cascaded arrangement with the digital replica and the digital filter so that a further estimated response provided by the further digital replica is combined with the digital modulator output signal to provide the derived filtered signal for the digital filter, and that a further digital filtered signal provided by the further digital filter is combined with the digital filtered signal to provide the cancellation signal.

6. The analog-to-digital converter according to claim 1, wherein the digital filter is an adaptive filter.

7. The analog-to-digital converter according to claim 1, wherein the interference cancellation loop is substantially linear between an output of the sigma-delta modulator and an input of the digital-to-analog converter.

8. The analog to digital converter according to claim 1, wherein the frequency band of the digital filter comprises, overlaps, or within a frequency range of an expected interference signal.

9. An analog-to-digital converter for converting an input signal, the analog-to-digital converter comprising:
a sigma-delta modulator configured to receive an analog modulator input signal and provide a digital modulator output signal; and
an interference cancellation loop, comprising:
a digital filter configured to amplify the digital modulator output signal in a frequency band, attenuate the digital modulator output signal outside the frequency band and a transition band surrounding the frequency band, and provide a filtered digital feedback signal;
a digital-to-analog converter configured to convert the filtered digital feedback signal to a cancellation signal; and
a signal combiner configured to combine the analog modulator input signal with the cancellation signal resulting in the analog modulator input signal, in order to at least partially cancel interference signal portions within the analog modulator input signal, wherein the interference cancellation loop comprises a cascaded arrangement of at least two feedback branches, each feedback branch comprising a digital filter and a digital-to-analog converter.

10. An apparatus, comprising:
a baseband processor;
an antenna port; and
an analog-to-digital converter configured to convert an input signal, the analog-to-digital converter being coupled to the baseband processor and the antenna port, and comprising:
a sigma-delta modulator configured to receive an analog modulator input signal and provide a digital modulator output signal; and
an interference cancellation loop, comprising:
a digital filter configured to amplify the digital modulator output signal in a frequency band, attenuate the digital modulator output signal outside the frequency band and a transition band surrounding the frequency band, and provide a filtered digital feedback signal;
a digital-to-analog converter configured to convert the filtered digital feedback signal to a cancellation signal; and
a signal combiner configured to combine the analog modulator input signal with the cancellation signal resulting in the analog modulator input signal, in order to at least partially cancel interference signal portions within the analog modulator input signal,
wherein the interference cancellation loop comprises a digital replica of a signal transfer function of the sigma-delta modulator, wherein the digital replica is configured to receive the filtered digital feedback signal or a derived filtered signal, and provide an estimated response of the sigma-delta modulator in response to the digital filtered feedback signal or the derived filtered signal, wherein the estimated response is combined with the digital modulator output signal or a derived modulator output signal to provide an output signal of the analog-to-digital converter.

11. A signal processor, comprising
a forward signal processing path comprising a sigma-delta modulator; and
a feedback signal processing path comprising a digital controller configured to condition a modulator output signal from the sigma-delta modulator and feed a resulting cancellation signal to an input of the forward signal processing path for selective cancellation of signal portions of an input signal of the signal processor, wherein the digital controller is configured to amplify an out-of-band frequency range so that feeding the resulting cancellation signal to the input of the forward signal processing path reduces out-of-band signal portions within the out-of-band frequency range of the input signal of the signal processor,
wherein the feedback signal processing path comprises a cascaded arrangement of at least two feedback branches, each feedback branch comprising a digital controller.

12. A signal processor, comprising
a forward signal processing path comprising a sigma-delta modulator; and
a feedback signal processing path comprising a digital controller configured to condition a modulator output signal from the sigma-delta modulator and feed a resulting cancellation signal to an input of the forward signal processing path for selective cancellation of signal portions of an input signal of the signal processor, wherein the digital controller is configured to amplify an out-of-band frequency range so that feeding the resulting cancellation signal to the input of the forward signal processing path reduces out-of-band signal portions within the out-of-band frequency range of the input signal of the signal processor,
wherein the feedback signal processing path comprises a replica of a signal transfer function of the forward signal processing path, wherein the digital replica is configured to receive a controller output signal from the digital controller, or a signal derived from the controller output signal, and provide an estimated response of the forward signal processing path in response to the controller output signal, wherein the estimated response is combined with a forward path output signal provided by the forward signal path to provide an output signal of the signal processor.

13. The signal processor according to claim 12, wherein the sigma-delta modulator is configured to receive an analog modulator input signal and wherein the modulator output signal is a digital signal.

14. The signal processor according to claim 12, wherein the digital controller comprises a digital resonator.

15. The signal processor according to claim 12, wherein the feedback signal processing path further comprises a digital noise shaper.

16. The signal processor according to claim 12, wherein the digital controller comprises a digital noise shaper.

17. The signal processor according to claim 12, wherein the feedback signal processing path comprises a further digital replica of the signal transfer function of the forward signal processing path and a further digital controller, wherein the further digital replica and the further digital controller are arranged in a cascaded arrangement with the digital replica and the digital controller so that a further estimated response provided by the further digital replica is combined with forward path output signal to provide the signal derived from the controller output signal to the digital controller, and that a further controller output signal provided by the further digital controller is combined with the controller output signal to provide the cancellation signal.

18. The signal processor according to claim 12, wherein the digital controller comprises an adaptive controller.

19. An analog-to-digital converter for converting an input signal, the analog-to-digital converter comprising:
   means for combining the input signal with a cancellation signal and for providing a corresponding modulator input signal;
   means for sigma-delta modulating the modulator input signal and for providing a sigma-delta modulated signal;
   means for amplifying the sigma-delta modulated signal in a frequency band and for attenuating the sigma-delta modulated signal outside the frequency band and a transition band surrounding the frequency band to obtain a filtered sigma-delta modulated signal;
   means for digital-to-analog converting the filtered sigma-delta modulated signal to obtain the cancellation signal; and
   means for digital replicating a signal transfer function of the means for sigma-delta modulating and for receiving the filtered sigma-delta modulated signal or a derived filtered signal, and for providing an estimated response of the means for sigma-delta modulating modulating in response to the filtered sigma-delta modulated signal or the derived filtered signal, wherein the estimate response is combined with the sigma-delta modulated signal or a derived modulated output signal to provide an output signal of the means for the analog-to-digital converter.

20. A method for analog-to-digital conversion, comprising:
   receiving an analog modulator input signal;
   combining the analog modulator input signal with a cancellation signal, resulting in an analog modulator input signal;
   sigma-delta modulating the analog modulator input signal, resulting in a digital modulator output signal;
   providing an output signal of the method for analog-to-digital conversion based on the digital modulator output signal;
   filtering the digital modulator output signal or a derived digital modulator output signal within a passband frequency range; and
   digital-to-analog converting a filtered signal resulting in the cancellation signal, the filtered signal based on the filtering, so that the cancellation signal cancels, at least partially, interference signal portions of the analog modulator input signal that are in the passband frequency range;
   digitally estimating, using a digital replica of a signal transfer function of the action of sigma-delta modulating, a response of the action of sigma-delta modulating to a digital representation of the cancellation signal; and
   combining the estimated response with the modulator output signal to obtain the output signal of the method of analog-to-digital conversion.

21. The method according to claim 20, wherein filtering attenuates the digital modulator output signal in an in-band frequency range of the input signal and relatively amplifies the digital modulator output signal in an out-of-band frequency range of the input signal.

22. The method according to claim 20, further comprising:
   digitally noise shaping the digital modulator output signal or the filtered signal.

23. An apparatus, comprising:
   a baseband processor;
   an antenna port; and
   a signal processor coupled to the baseband processor and the antenna port, and comprising:
      a forward signal processing path comprising a sigma-delta modulator; and
      a feedback signal processing path comprising a digital controller configured to condition a modulator output signal from the sigma-delta modulator and feed a resulting cancellation signal to an input of the forward signal processing path for selective cancellation of signal portions of an input signal of the signal processor, wherein the digital controller is configured to amplify an out-of-band frequency range so that feeding the resulting cancellation signal to the input of the forward signal processing path reduces out-of-band signal portions within the out-of-band frequency range of the input signal of the signal processor,
   wherein the feedback signal processing path comprises a digital replica of a signal transfer function of the forward signal processing path, wherein the digital replica is configured to receive a controller output signal from the digital controller, or a signal derived from the controller output signal, and provide an estimated response of the forward signal processing path in response to the controller output signal, wherein the estimated response is combined with a forward path output signal provided by the forward signal path to provide an output signal of the signal processor.

* * * * *